US012721016B2

(12) United States Patent
Jia et al.

(10) Patent No.: US 12,721,016 B2
(45) Date of Patent: Aug. 25, 2026

(54) DISPLAY PANEL, MANUFACTURING METHOD THEREOF AND DISPLAY APPARATUS

(71) Applicants: Hefei BOE Joint Technology Co., Ltd., Hefei (CN); BOE Technology Group Co., Ltd., Beijing (CN); Beijing BOE Technology Development Co., Ltd., Beijing (CN)

(72) Inventors: Wenbin Jia, Beijing (CN); Huaiting Shih, Beijing (CN); Xiang Wan, Beijing (CN)

(73) Assignees: Hefei BOE Joint Technology Co., Ltd., Hefei (CN); BOE Technology Group Co., Ltd., Beijing (CN); Beijing BOE Technology Development Co., Ltd., Beijing (CN)

( * ) Notice: Subject to any disclaimer, the term of this patent is extended or adjusted under 35 U.S.C. 154(b) by 380 days.

(21) Appl. No.: 18/294,148

(22) PCT Filed: Apr. 26, 2023

(86) PCT No.: PCT/CN2023/090840
§ 371 (c)(1),
(2) Date: Jan. 31, 2024

(87) PCT Pub. No.: WO2024/221273
PCT Pub. Date: Oct. 31, 2024

(65) Prior Publication Data

US 2025/0107411 A1 Mar. 27, 2025

(51) Int. Cl.

| | |
|---|---|
| ***H10K 59/122*** | (2023.01) |
| ***H10K 59/38*** | (2023.01) |
| ***H10K 59/80*** | (2023.01) |

(52) U.S. Cl.
CPC ......... *H10K 59/879* (2023.02); *H10K 59/122* (2023.02); *H10K 59/38* (2023.02); *H10K 59/873* (2023.02); *H10K 59/8792* (2023.02)

(58) Field of Classification Search
CPC .... H10K 59/879; H10K 59/122; H10K 59/38; H10K 59/873; H10K 59/8792; H10K 50/80; H10H 29/10
See application file for complete search history.

(56) References Cited

U.S. PATENT DOCUMENTS

| | | | |
|---|---|---|---|
| 2009/0115039 | A1 | 5/2009 | Ikuta et al. |
| 2011/0062476 | A1 | 3/2011 | Tobise |

(Continued)

FOREIGN PATENT DOCUMENTS

| | | | |
|---|---|---|---|
| CN | 111162110 | A | 5/2020 |
| CN | 111653683 | A | 9/2020 |

(Continued)

*Primary Examiner* — Elias Ullah
(74) *Attorney, Agent, or Firm* — Nath, Goldberg & Meyer; Joshua B. Goldberg

(57) ABSTRACT

A display panel is provided, including a driving back plate, sub-pixels and micro-lens units; the micro-lens units are on a side of the sub-pixels away from the driving back plate; an orthographic projection of each micro-lens unit covers an orthographic projection of an opening of the corresponding sub-pixel; a pattern of each micro-lens unit is axisymmetric with respect to an axis in any cross section perpendicular to the driving back plate and passing through a center of the orthographic projection of the micro-lens unit; the axis is a straight line passing through the center and perpendicular to the driving back plate; in the cross section, a distance from any point on a side of the micro-lens unit away from the driving back plate to the center is D, a length of a side of the micro-lens unit close to the driving back plate is 2R, and $0.9 \leq D/R \leq 1.0$.

20 Claims, 11 Drawing Sheets

(56) References Cited

U.S. PATENT DOCUMENTS

| | | | |
|---|---|---|---|
| 2019/0384066 | A1 | 12/2019 | Deng |
| 2022/0199715 | A1 | 6/2022 | Kim et al. |

FOREIGN PATENT DOCUMENTS

| | | | |
|---|---|---|---|
| CN | 112382648 | A | 2/2021 |
| CN | 113471259 | A | 10/2021 |
| CN | 114141969 | A | 3/2022 |
| JP | 2003264059 | A | 9/2003 |

13
41
42
43
H'
r
12
7
2
11
3
511
512
50
513
5

A-A

DISPLAY PANEL, MANUFACTURING METHOD THEREOF AND DISPLAY APPARATUS

This is a National Phase Application filed under 35 U.S.C. 371 as a national stage of PCT/CN2023/090840, filed Apr. 26, 2023, the content of which is hereby incorporated by reference in its entirety.

TECHNICAL FIELD

The present disclosure relates to the field of display technology, and in particular to a display panel, a method for manufacturing a display panel and a display apparatus.

BACKGROUND

An OLED (organic light-emitting diode) display screen has received wide attention due to its advantages, such as self-luminescence, low power consumption, lightness, thinness, flexibility, gorgeous color, high contrast, and fast response speed and the like.

SUMMARY

In a first aspect, embodiments of the present disclosure provide a display panel, including a driving back plate, a pixel defining layer, a plurality of sub-pixels and a plurality of micro-lens units, wherein the pixel defining layer is on a side of the driving back plate, and includes a plurality of openings therein, the plurality of sub-pixels are respectively in different openings; the plurality of micro-lens units are on a side of the plurality of sub-pixels away from the driving back plate, and are in a one-to-one correspondence with the plurality of sub-pixels, an orthographic projection of each micro-lens unit on the driving back plate covers an orthographic projection of an opening where the sub-pixel corresponding to the micro-lens unit is located on the driving back plate; a pattern of each micro-lens unit is axisymmetric with respect to an axis in any cross section which is perpendicular to the driving back plate and passes through a center of the orthographic projection of the micro-lens unit on the driving back plate; the axis is a straight line which passes through the center of the orthographic projection of the micro-lens unit on the driving back plate and is perpendicular to the driving back plate; in any cross section of the micro-lens unit which is perpendicular to the driving back plate and passes through the center of the orthographic projection of the micro-lens unit on the driving back plate, a distance from any point on a side of the micro-lens unit away from the driving back plate to the center of the orthographic projection of the micro-lens unit on the driving back plate is D, a length of a side of the micro-lens unit close to the driving back plate is 2R, and $0.9 \leq D/R \leq 1.0$.

In some embodiments, the display panel further includes a color filter layer on a side of the plurality of micro-lens units away from the driving back plate; the color filter layer includes a black matrix and a plurality of color filters, the black matrix and the plurality of color filters are arranged in a same layer, the plurality of color filters are in a one-to-one correspondence with the plurality of sub-pixels; and an orthographic projection of each color filter on the driving back plate covers an orthographic projection of an opening where the sub-pixel corresponding to the color filter is located on the driving back plate.

In some embodiments, the display panel further includes a color filter layer on a side of the plurality of sub-pixels away from the driving back plate and on a side of the plurality of micro-lens units close to the driving back plate; the color filter layer includes a black matrix and a plurality of color filters, the black matrix and the plurality of color filters are arranged in a same layer, the plurality of color filters are in a one-to-one correspondence with the plurality of sub-pixels; and an orthographic projection of each color filter on the driving back plate covers an orthographic projection of an opening where the sub-pixel corresponding to the color filter is located on the driving back plate.

In some embodiments, a surface of each micro-lens unit away from the driving back plate is a circular arc surface, and a surface of each micro-lens unit close to the driving back plate is a plane.

In some embodiments, an angle between a tangent line at an intersection point of the plane with the circular arc surface of each micro-lens unit and the plane is in a range of 40° to 90°.

In some embodiments, a distance between a vertex of the circular arc surface and a center of the plane is H, a radius of the plane is R', and H/R' is in a range of 0.4 to 1.

In some embodiments, an area of an orthographic projection of each micro-lens unit on the driving back plate is not less than that of an orthographic projection of an opening where the sub-pixel corresponding to the micro-lens unit is located on the driving back plate; and an area of an orthographic projection of each color filter on the driving back plate is not less than that of an orthographic projection of the micro-lens unit corresponding to the color filter on the driving back plate.

In some embodiments, an area of an orthographic projection of each color filter on the driving back plate is not less than that of an orthographic projection of an opening where the sub-pixel corresponding to the color filter is located on the driving back plate; and an area of an orthographic projection of each micro-lens unit on the driving back plate is not less than that of an orthographic projection of the color filter corresponding to the micro-lens unit on the driving back plate.

In some embodiments, the plurality of sub-pixels includes a plurality of first sub-pixels, a plurality of second sub-pixels, and a plurality of third sub-pixels, the plurality of color filters include a plurality of first color filters, a plurality of second color filters and a plurality of third color filters, the plurality of first color filters, the plurality of second color filters and the plurality of third color filters have different colors; the plurality of first sub-pixels correspond to the plurality of first color filters, and the plurality of first sub-pixels and the plurality of first color filters have the same color; the plurality of second sub-pixels correspond to the plurality of second color filters, and the plurality of second sub-pixels and the plurality of second color filters have the same color; the plurality of third sub-pixels correspond to the plurality of third color filters, and the plurality of third sub-pixels and the plurality of third color filters have the same color; openings where the plurality of first sub-pixels, the plurality of second sub-pixels and the plurality of third sub-pixels are located have different opening areas; the plurality of first color filters, the plurality of second color filters and the plurality of third color filters have different thicknesses; the plurality of micro-lens units include a plurality of first micro-lens units, a plurality of second micro-lens units, and a plurality of third micro-lens units, the plurality of first sub-pixels correspond to the plurality of first micro-lens units; the plurality of second sub-pixels correspond to the plurality of second micro-lens units; the plurality of third sub-pixels correspond to the plurality of third micro-lens units; and the plurality of first micro-lens units, the plurality of second micro-lens units, and the plurality of third micro-lens units have the same size and the same shape.

In some embodiments, the display panel further includes a first planarization layer and an encapsulation layer, wherein the encapsulation layer is on a side of the plurality of sub-pixels away from the driving back plate and on a side of the plurality of micro-lens units close to the driving back plate, surfaces of portions of the encapsulation layer away from the driving back plate are flush with each other; the first planarization layer is on a side of the plurality of micro-lens units away from the driving back plate and on a side of the color filter layer close to the driving back plate, and surfaces of portions of the first planarization layer away from the driving back plate are flush with each other.

In some embodiments, the encapsulation layer has the same refractive index as each micro-lens units; the refractive index of each micro-lens unit is greater than that of the first planarization layer; the refractive index of each micro-lens unit is n2, and the refractive index of the first planarization layer is n3, and $n2-n3>0.09$.

In some embodiments, $f=(n3\times R1)/(n2-n3)$; $f=h\times n1$; where f is a focal length of each micro-lens unit; R1 is a radius of a circular arc surface of each micro-lens unit away from the driving back plate; h is a thickness of the encapsulation layer; and n1 is the refractive index of the encapsulation layer.

In some embodiments, the display panel further includes an encapsulation layer and a second planarization layer, the encapsulation layer is on a side of the plurality of sub-pixels away from the driving back plate and on a side of the color filter layer close to the driving back plate; the second planarization layer is on a side of the color filter layer away from the driving back plate and on a side of the plurality of micro-lens units close to the driving back plate, surfaces of portions of the encapsulation layer away from the driving back plate are flush with each other; surfaces of portions of the second planarization layer in contact with the corresponding first micro-lens unit, the corresponding second micro-lens unit, and the corresponding third micro-lens unit are flush with each other; and the portions of the second planarization layer in contact with the corresponding first micro-lens unit, the corresponding second micro-lens unit, and the corresponding third micro-lens unit have different thicknesses.

In some embodiments, an average value of thicknesses of the corresponding first color filter, the corresponding second color filter and the corresponding third color filter is a first average value, and a difference among the thicknesses of the portions of the second planarization layer in contact with the corresponding first micro-lens unit, the corresponding second micro-lens unit and the corresponding third micro-lens unit is a difference among a difference between the thickness of the corresponding first color filter and the first average value, a difference between the thickness of the corresponding second color filter and the first average value and a difference between the thickness of the corresponding third color filter and the first average value.

In some embodiments, a difference between the thicknesses of the portions of the second planarization layer in contact with the corresponding first micro-lens unit and the corresponding second micro-lens unit is a difference between the thicknesses of the corresponding first color filter and the corresponding second color filter; and a difference between the thicknesses of the portions of the second planarization layer in contact with the corresponding first micro-lens unit and the corresponding third micro-lens unit is a difference between the thicknesses of the corresponding first color filter and the corresponding third color filter.

In some embodiments, the display panel further includes an encapsulation layer and a second planarization layer, the encapsulation layer is located on a side of the plurality of sub-pixels away from the driving back plate and on a side of the color filter layer close to the driving back plate; the second planarization layer is on a side of the color filter layer away from the driving back plate and on a side of the plurality of micro-lens units close to the driving back plate; portions of the encapsulation layer in contact with the corresponding first color filter, the corresponding second color filter, and the corresponding third color filter have different thicknesses; surfaces of portions of the corresponding first color filter, the corresponding second color filter, and the corresponding third color filter away from the driving back plate are flush with each other; and surfaces of portions of the second planarization layer away from the driving back plate are flush with each other.

In some embodiments, an average value of thicknesses of the corresponding first color filter, the corresponding second color filter and the corresponding third color filter is a first average value, and a difference among the thicknesses of the portions of the encapsulation layer in contact with the corresponding first color filter, the corresponding second color filter and the corresponding third color filter is a in difference among a difference between the thickness of the corresponding first color filter and the first average value, a difference between the thickness of the corresponding second color filter and the first average value and a difference between the thickness of the corresponding third color filter and the first average value.

In some embodiments, a difference between the thicknesses of the portions of the encapsulation layer in contact with the corresponding first color filter and the corresponding second color filter is a difference between the thicknesses of the corresponding first color filter and the corresponding second color filter; and a difference between the thicknesses of the portions of the encapsulation layer in contact with the corresponding first color filter and the corresponding third color filter is a difference between the thicknesses of the corresponding first color filter and the corresponding third color filter.

In some embodiments, the display panel further includes an encapsulation layer, a second planarization layer, and a third planarization layer, the encapsulation layer is on a side of the plurality of sub-pixels away from the driving back plate and on a side of the color filter layer close to the driving back plate, the second planarization layer is on a side of the color filter layer away from the driving back plate and on a side of the plurality of micro-lens units close to the driving back plate, the third planarization layer is on a side of the plurality of sub-pixels close to the driving back plate and on a side of the driving back plate close to the plurality of sub-pixels; each first sub-pixel includes a first anode, a first light-emitting functional layer and a first cathode sequentially stacked in a direction away from the third planarization layer; each second sub-pixel includes a second anode, a second light-emitting functional layer and a second cathode sequentially stacked in the direction away from the third planarization layer; each third sub-pixel includes a third anode, a third light-emitting functional layer and a third cathode sequentially stacked in the direction away from the third planarization layer; portions of the third planarization layer in contact with the first anode, the second anode and the third anode have different thicknesses; portions of the encapsulation layer in contact with the corresponding first color filter, the corresponding second color filter and the corresponding third color filter have the same thickness; surfaces of portions of the corresponding first color filter, the corresponding second color filter, and the corresponding third color filter away from the driving back plate are flush with each other, and surfaces of portions of the second planarization layer away from the driving back plate are flush with each other.

In some embodiments, an average value of the thicknesses of the corresponding first color filter, the corresponding second color filter, and the corresponding third color filter is a first average value, and a difference among the thicknesses of the portions of the third planarization layer in contact with the first anode, the second anode and the third anode is a difference among a difference between the thickness of the corresponding first color filter and the first average value, a difference between the thickness of the corresponding second color filter and the first average value and a difference between the thickness of the corresponding third color filter and the first average value.

In some embodiments, a difference between the thicknesses of the portions of the third planarization layer in contact with the first anode and the second anode is a difference between the thicknesses of the corresponding first color filter and the corresponding second color filter; and a difference between the thicknesses of the portions of the third planarization layer in contact with the first anode and the third anode is a difference between the thicknesses of the corresponding first color filter and the corresponding third color filter.

In some embodiments, the display panel further includes a protective layer on a side of the plurality of micro-lens units away from the driving back plate; wherein the second planarization layer has the same refractive index as each micro-lens unit; the refractive index of each micro-lens unit is greater than that of the protective layer; the refractive index of each micro-lens unit is n2, and the refractive index of the protective layer is n4, and $n2-n4>0.09$.

In some embodiments, $f=(n4\times R1)/(n2-n4)$; $f=h1\times n5+h2\times n6+h3\times n7$; where f is a focal length of each micro-lens unit; R1 is a radius of a circular arc surface of the micro-lens unit away from the driving back plate; h1 is a thickness of the second planarization layer; n5 is the refractive index of the second planarization layer; h2 is a thickness of the color filter corresponding to the micro-lens unit; n6 is a refractive index of the color filter corresponding to the micro-lens unit; h3 is a thickness of a portion of the encapsulation layer corresponding to the micro-lens unit; and n7 is a refractive index of the portion of the encapsulation layer corresponding to the micro-lens unit.

In some embodiments, each micro-lens unit includes one micro-lens, and a duty ratio of the micro-lens in an area of an orthographic projection of an opening where the corresponding sub-pixel is located on the driving back plate is 100%; or each micro-lens unit includes a plurality of micro-lenses, a duty ratio of which in an area of an orthographic projection of an opening where the corresponding sub-pixel is located on the driving back plate is more than 70%.

In some embodiments, the plurality of sub-pixels are arranged in an array, and the plurality of micro-lens units are arranged in an array.

In a second aspect, embodiments of the present disclosure provide a method for manufacturing a display panel, including: forming a driving back plate; forming a pixel defining layer on a side of the driving back plate and forming a plurality of openings in the pixel defining layer; forming a plurality of sub-pixels; where the plurality of sub-pixels are respectively located in different openings; and forming a plurality of micro-lens units on a side of the plurality of sub-pixels away from the driving back plate; wherein the plurality of micro-lens units are in a one-to-one correspondence with the plurality of sub-pixels, an orthographic projection of each micro-lens unit on the driving back plate covers an orthographic projection of an opening where the sub-pixel corresponding to the micro-lens unit is located on the driving back plate; a pattern of each micro-lens unit is axisymmetric with respect to an axis in any cross section which is perpendicular to the driving back plate and passes through a center of the orthographic projection of the micro-lens unit on the driving back plate; the axis is a straight line which passes through the center of the orthographic projection of the micro-lens unit on the driving back plate and is perpendicular to the driving back plate; in any cross section of the micro-lens unit which is perpendicular to the driving back plate and passes through the center of the orthographic projection of the micro-lens unit on the driving back plate, a distance from any point on a side of the micro-lens unit away from the driving back plate to the center of the orthographic projection of the micro-lens unit on the driving back plate is D, a length of a side of the micro-lens unit close to the driving back plate is 2R, and $0.9\leq D/R\leq 1.0$.

In a third aspect, embodiments of the present disclosure further provide a display apparatus, which includes the display panel.

BRIEF DESCRIPTION OF DRAWINGS

The accompanying drawings, which are provided for further understanding of embodiments of the present disclosure and constitute a part of this specification, are for explaining the present disclosure together with the embodiments of the present disclosure, but are not intended to limit the present disclosure. The above and other features and advantages will become more apparent to one of ordinary skill in the art by describing in detail exemplary embodiments thereof with reference to the drawings. In the drawings.

DETAIL DESCRIPTION OF EMBODIMENTS

Figure 1A:
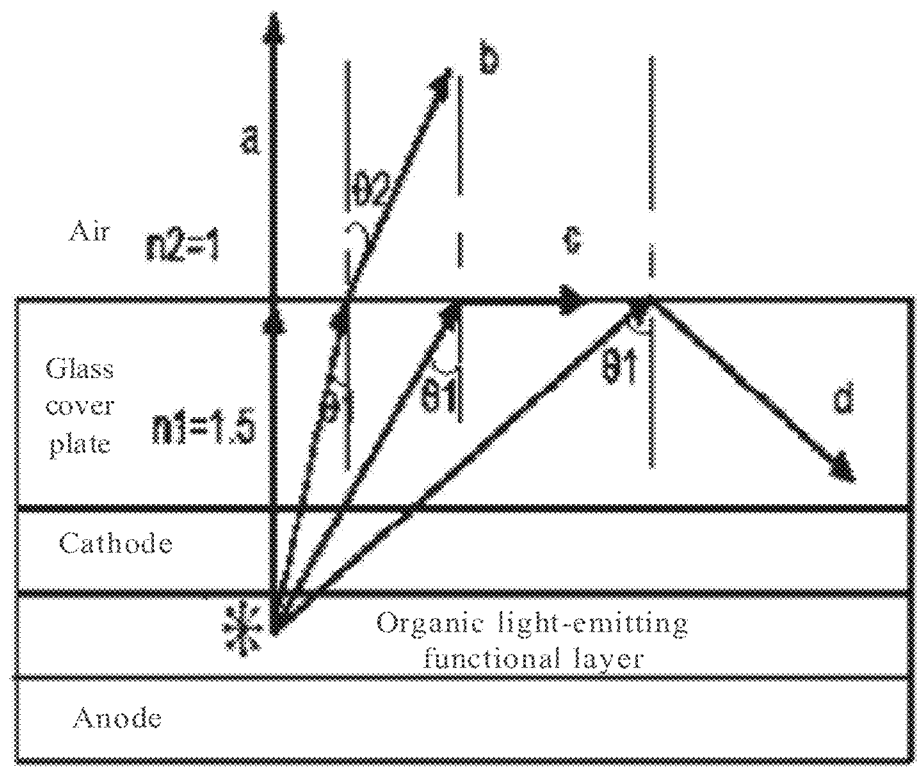
FIG. 1*a* is a schematic diagram illustrating light outgoing of an OLED device in the related art.

In order to enable one of ordinary skill in the art to better understand the technical solutions of the embodiments of the present disclosure, a display panel, a method for manufacturing a display panel and a display apparatus provided by the embodiments of the present disclosure will be described in further detail with reference to the accompanying drawings and the detailed description.

The embodiments of the present disclosure will be described more fully hereinafter with reference to the accompanying drawings, but the embodiments shown may be embodied in different forms and should not be construed as limited to the embodiments set forth herein. Rather, these embodiments are provided so that this disclosure will be thorough and complete, and will fully convey the scope of the present disclosure to one ordinary skill in the art.

The embodiments of the present disclosure are not limited to the embodiments shown in the drawings, but include modifications of configurations formed based on a manufacturing process. Thus, areas illustrated in the drawings have schematic properties, and shapes of the areas shown in the drawings illustrate specific shapes of the areas, but are not intended to be limiting.

In the related art, FIG. 1*a* is a schematic diagram illustrating light outgoing of an OLED device in the related art. Referring to FIG. 1*a*, the OLED device has low light outgoing efficiency due to materials used and a light outgoing mode, which is mainly caused by internal and external waveguide effect and total reflection. At present, the light outgoing efficiency is improved mainly by reducing the non-light-emitting factors, eliminating the waveguide effect and reducing the total reflection.

Figures 1B, 1C:
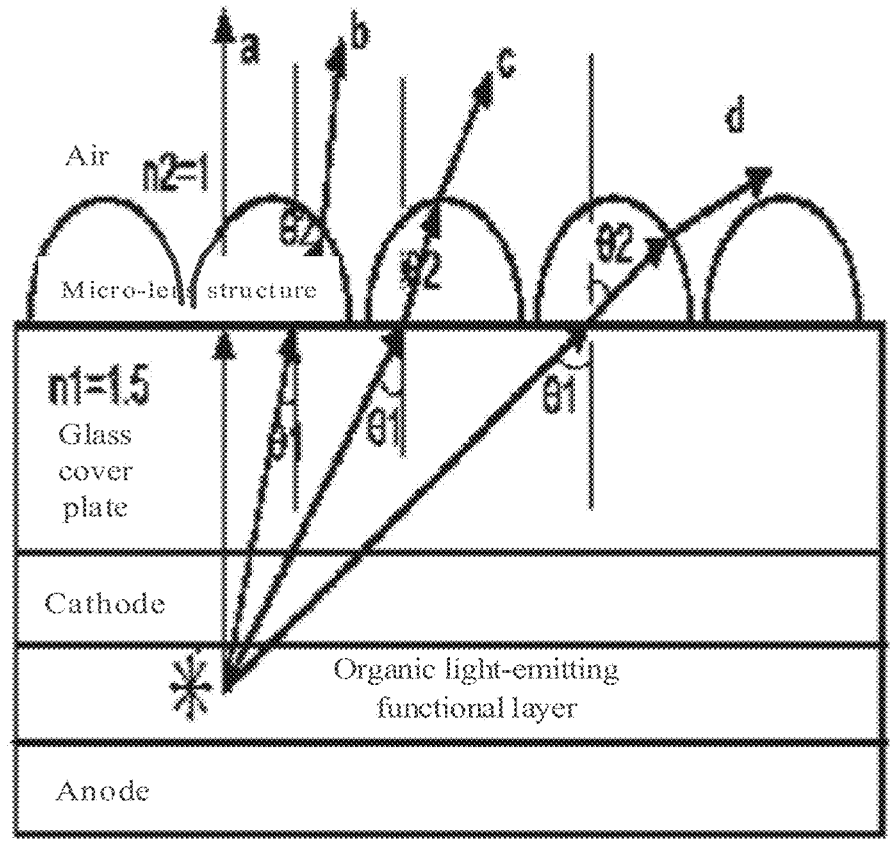
FIG. 1*b* is a schematic diagram illustrating light outgoing of an OLED device adopting a micro-lens structure in the related art.
FIG. 1*c* is a schematic cross-sectional view of a structure of a silicon-based OLED display panel in the related art.

FIG. 1*b* is a schematic diagram illustrating light outgoing of an OLED device adopting a micro-lens structure in the related art. Referring to FIG. 1*b*, the total reflection at an interface is inhibited in the micro-lens structure by utilizing an uneven surface pattern on a side of the micro-lens structure away from the OLED device; and a light outgoing surface of the OLED device is increased and the light at an edge is accumulated inwards, which can extract more light, but can cause the problems of light leakage at the edge of an OLED display panel pixel (i.e., the OLED device) and a large viewing-angle chromatic aberration. How to eliminate or avoid the problems of the light leakage at the edge of the pixel and the large viewing-angle chromatic aberration in the context of improving the light extraction efficiency of the pixel It has become a problem to be urgently solved.

FIG. 1*c* is a schematic cross-sectional view of a structure of a silicon-based OLED display panel in the related art. Referring to FIG. 1*c*, the silicon-based OLED display panel includes a substrate 11 provided with a driving circuit, a pixel defining layer 2, a plurality of sub-pixels 3, an encapsulation layer 7, a color filter layer 5, a planarization layer 12 and a micro-lens layer 13; the pixel defining layer 2 is arranged on a side of the substrate 11, and includes a plurality of openings therein, and the plurality of sub-pixels 3 are respectively located in the plurality of openings; the encapsulation layer 7, the color filter layer 5, the planarization layer 12 and the micro-lens layer 13 are sequentially stacked on a side of the plurality of sub-pixels 3 away from the substrate 11. The color filter layer 5 includes a first color filter 511, a second color filter 512, a third color filter 513 and a black matrix 50, the first color filter 511, the second color filter 512 and the third color filter 513 have different colors; the black matrix 50 is located between every two adjacent color filters, the black matrix 50 is disposed corresponding to the pixel defining layer 2, and the plurality of sub-pixels 3 are in one-to-one correspondence with the color filters. The micro-lens layer 13 includes first micro-lens units 41, second micro-lens units 42 and third micro-lens units 43, which are in one-to-one correspondence with the plurality of sub-pixels 3.

As can be seen from FIG. 1*c*, a thickness of the second color filter 512 is significantly greater than that of each of the first color filter 511 and the third color filter 513, which causes unevenness on a surface of the planarization layer 12 away from the substrate 11, the planarization layer 12 is located on a side of the color filter layer 5 away from the substrate 11. That is, a height difference exists between a surface region of the planarization layer 12 in contact with the second micro-lens unit 42 and a surface region of the planarization layer 12 in contact with each of the first micro-lens unit 41 and the third micro-lens unit 43. The planarization layer 12 has a certain drying shrinkage ratio in the manufacturing process, and if the height difference between the different surface regions of the planarization layer 12 away from the substrate 11 is great, generally, the height difference between the different surface regions of the planarization layer 12 away from the substrate 11 is not completely eliminated, which may result in an incomplete shape of the second micro-lens unit 42 formed on the side of the planarization layer 12 away from the substrate 11. For example, a shape of each of the first micro-lens unit 41 and the third micro-lens unit 43 is completely hemispherical, and has a ratio of a radius to a height to be equal to 1; the second micro-lens unit 42 is formed with an incomplete hemispherical shape, which has a height H' of the second micro-lens unit 42 smaller than a radius r of the second micro-lens unit 42. That is, a ratio of the radius r to the height H' of the second micro-lens unit 42 is not equal to 1, which causes the problems of light leakage at the edge of the sub-pixel 3 corresponding to the second micro-lens unit 42, and a large viewing-angle chromatic aberration (that is, the chromatic aberration occurring after light of different colors are mixed at a large viewing angle, which is caused by the light leakage at the edge of the sub-pixel) in the silicon-based OLED display panel and an optical light leakage problem, thereby seriously affecting the display effect of the silicon-based OLED display panel.

Figure 2A:
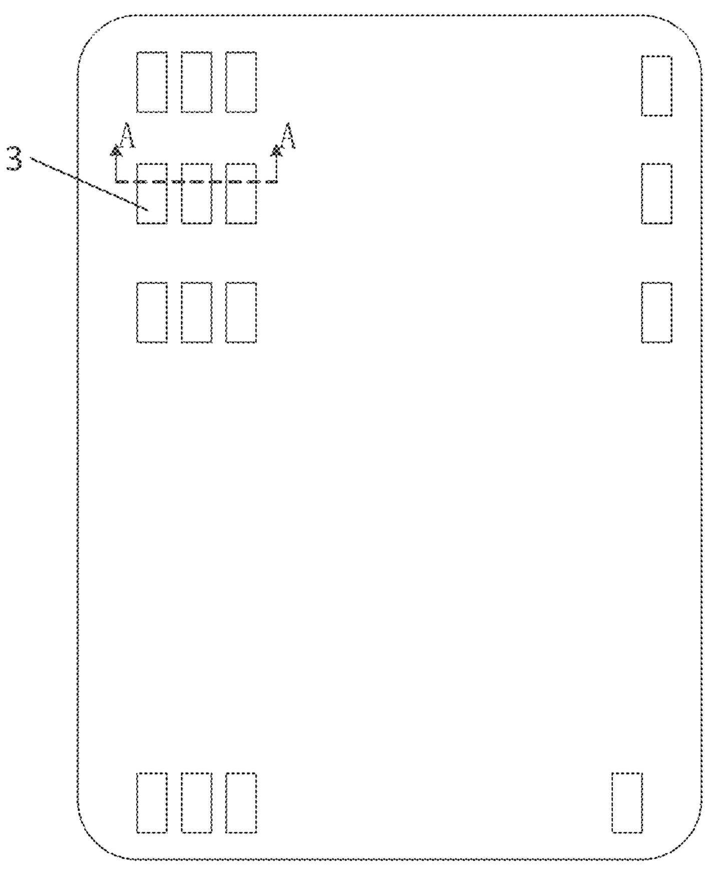
FIG. 2*a* is a schematic top view of a structure of a display panel according to embodiments of the present disclosure.
Figures 2B, 2C:
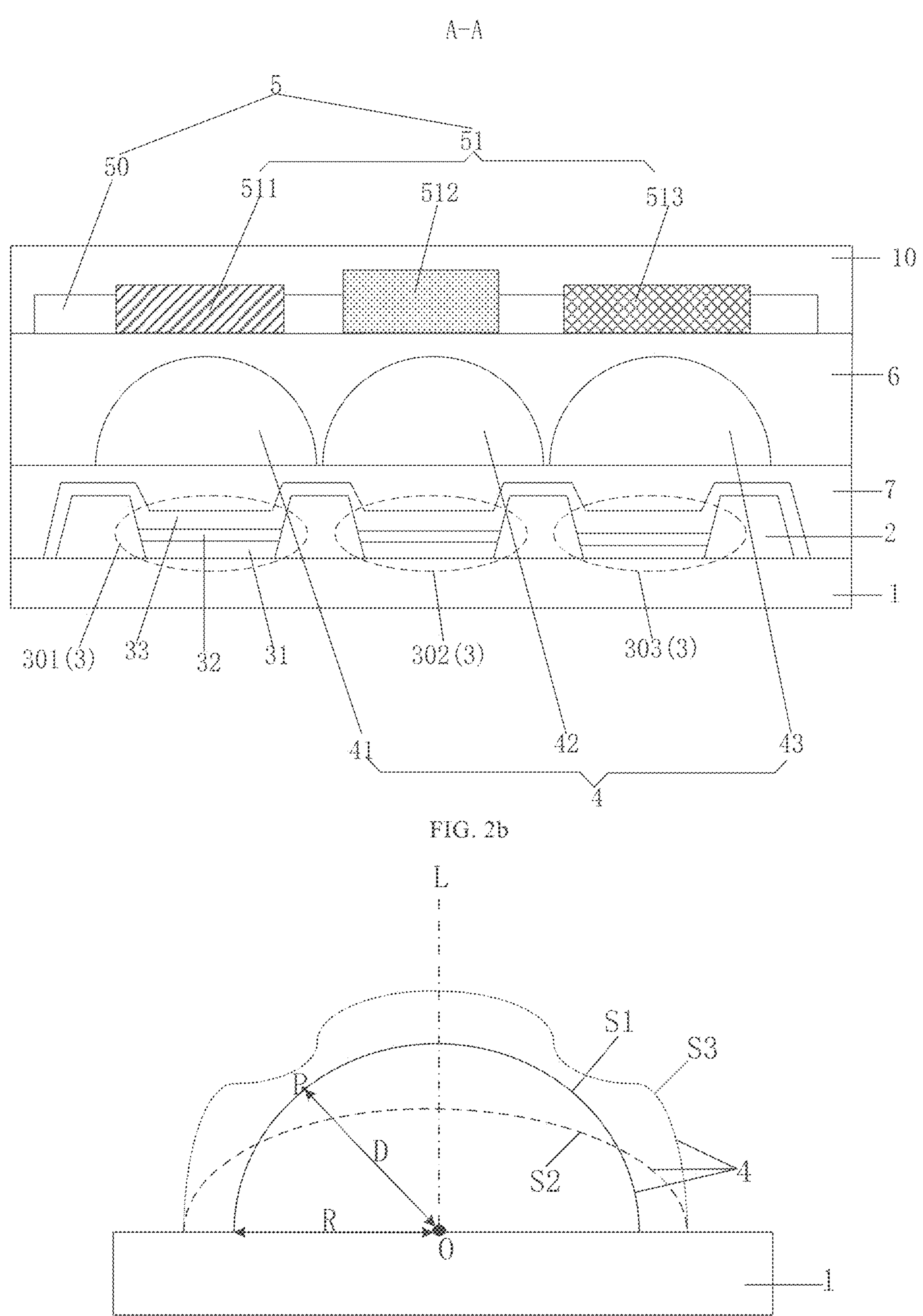
FIG. 2*b* is a cross-sectional view of a structure taken along a section line AA in FIG. 2*a*.
FIG. 2*c* is a schematic diagram of any cross section of a micro-lens unit perpendicular to a driving back plate and through a center of an orthographic projection of the micro-lens unit on the driving back plate according to embodiments of the present disclosure.

In order to solve the problems of the large viewing-angle chromatic aberration and the optical light leakage of the silicon-based OLED display panel caused by an incomplete morphology of the micro-lens unit in the related art, in a first aspect, embodiments of the present disclosure provide a display panel. FIG. 2*a* is a schematic top view of a structure of a display panel according to embodiments of the present disclosure. FIG. 2*b* is a cross-sectional view of a structure taken along a section line AA in FIG. 2*a*. FIG. 2*c* is a schematic diagram of any cross section of a micro-lens unit perpendicular to a driving back plate and through a center of an orthographic projection of the micro-lens unit on the driving back plate according to the embodiments of the present disclosure. Referring to FIGS. 2*a*, 2*b* and 2*c*, the display panel includes a driving back plate 1, a pixel defining layer 2, a plurality of sub-pixels 3 and a plurality of micro-lens units 4, the pixel defining layer 2 is located on a side of the driving back plate 1, and includes a plurality of openings therein, and the plurality of sub-pixels 3 are respectively located in different openings; the plurality of micro-lens units 4 are located on a side of the plurality of sub-pixels 3 away from the driving back plate 1, the plurality of micro-lens units 4 are in a one-to-one correspondence with the plurality of sub-pixels 3, an orthographic projection of each micro-lens unit on the driving back plate 1 covers an orthographic projection of the opening where the sub-pixel 3 corresponding to the micro-lens unit is located on the driving back plate 1; a pattern of each micro-lens unit 4 is axisymmetric with respect to an axis L in any cross section which is perpendicular to the driving back plate 1 and passes through a center O of the orthographic projection of the micro-lens unit 4 on the driving back plate 1; the axis L is a straight line which passes through the center O of the orthographic projection of the micro-lens unit 4 on the driving back plate 1 and is perpendicular to the driving back plate 1; in any cross section of the micro-lens unit 4 which is perpendicular to the driving back plate 1 and passes through the center O of the orthographic projection of the micro-lens unit 4 on the driving back plate 1, a distance from any point P on a side of the micro-lens unit 4 away from the driving back plate 1 to the center O of the orthographic projection of the micro-lens unit 4 on the driving back plate 1 is D, a length of a side of the micro-lens unit 4 close to the driving back plate 1 is 2R, and $0.9 \leq D/R \leq 1.0$.

In some embodiments, each sub-pixel 3 is an OLED (organic light-emitting diode) device. Each sub-pixel 3 includes a reflective anode 31, a light-emitting functional layer 32, and a cathode 33 sequentially stacked in a direction away from the driving back plate 1; and the light-emitting functional layer 32 emits light when a current is generated between the reflective anode 31 and the cathode 33. The light-emitting functional layer 32 may include: a hole injection layer, a hole transport layer, a light-emitting layer, an electron transport layer, and an electron injection layer, which are sequentially stacked. In this embodiment, a side of each sub-pixel 3 away from the driving back plate 1 is a light outgoing side of the sub-pixel 3, and the micro-lens unit 4 is disposed on the light outgoing side of the sub-pixel 3.

In some embodiments, a plurality of pixel circuits (not shown) are disposed in the driving back plate 1, and the pixel circuits are electrically connected to the reflective anodes 31 of the sub-pixels 3 to drive the sub-pixels 3 to emit light.

In some embodiments, referring to FIG. 2*c*, in any cross section which is perpendicular to the driving back plate 1 and passes through the center O of the orthographic projection of the micro-lens unit 4 on the driving back plate 1, a side of the micro-lens unit 4, with the axisymmetric cross section and $0.9 \leq D/R \leq 1.0$, away from the driving back plate 1 may be a circular arc line S1, or an elliptical arc line S2 or a wavy undulating arc line S3.

In this embodiment, the micro-lens units 4 are disposed on a side (i.e., a light outgoing side) of the sub-pixels 3 away from the driving back plate 1, and a surface (i.e., a light outgoing surface) of each micro-lens unit 4 away from the driving back plate 1 is an uneven surface, so that the total reflection at an interface through which the sub-pixel 3 emits the light can be inhibited, and a light outgoing surface of the sub-pixel 3 is increased and the light at edges of the light outgoing surface of the sub-pixel 3 is accumulated inwards, which can extract more light, thereby increasing the light-emitting efficiency of the sub-pixel 3. The pattern of each micro-lens unit 4 is axisymmetric with respect to an axis L in any cross section which is perpendicular to the driving back plate 1 and passes through the center O of the orthographic projection of the micro-lens unit 4 on the driving back plate 1; the axis L is a straight line which passes through the center O of the orthographic projection of the micro-lens unit 4 on the driving back plate 1 and is perpendicular to the driving back plate 1; in any cross section of the micro-lens unit 4 which is perpendicular to the driving back plate 1 and passes through the center O of the orthographic projection of the micro-lens unit 4 on the driving back plate 1, the distance from any point P on the side of the micro-lens unit 4 away from the driving back plate 1 to the center O of the orthographic projection of the micro-lens unit 4 on the driving back plate 1 is D, the length of the side of the micro-lens unit 4 close to the driving back plate 1 is 2R, and $0.9 \leq D/R \leq 1.0$. In this way, it can be ensured that the shape of the micro-lens unit 4 in the display panel is complete, thereby eliminating or avoiding the phenomenon of the light leakage at the edge of the sub-pixel 3 and further eliminating or avoiding the phenomenon of the large viewing-angle chromatic aberration and the optical light leakage of the display panel, and improving the display effect of the display panel.

In some embodiments, referring to FIG. 2*b*, the display panel further includes a color filter layer 5 located on a side of the plurality of micro-lens units 4 away from the driving back plate 1; the color filter layer 5 includes a black matrix 50 and a plurality of color filters 51 arranged in the same layer, and the plurality of color filters 51 and the plurality of sub-pixels 3 are in a one-to-one correspondence with each other; an orthographic projection of each color filter 51 on the driving back plate 1 covers an orthographic projection of the opening where the sub-pixel 3 corresponding to the color filter 51 is located on the driving back plate 1.

Figure 2D:
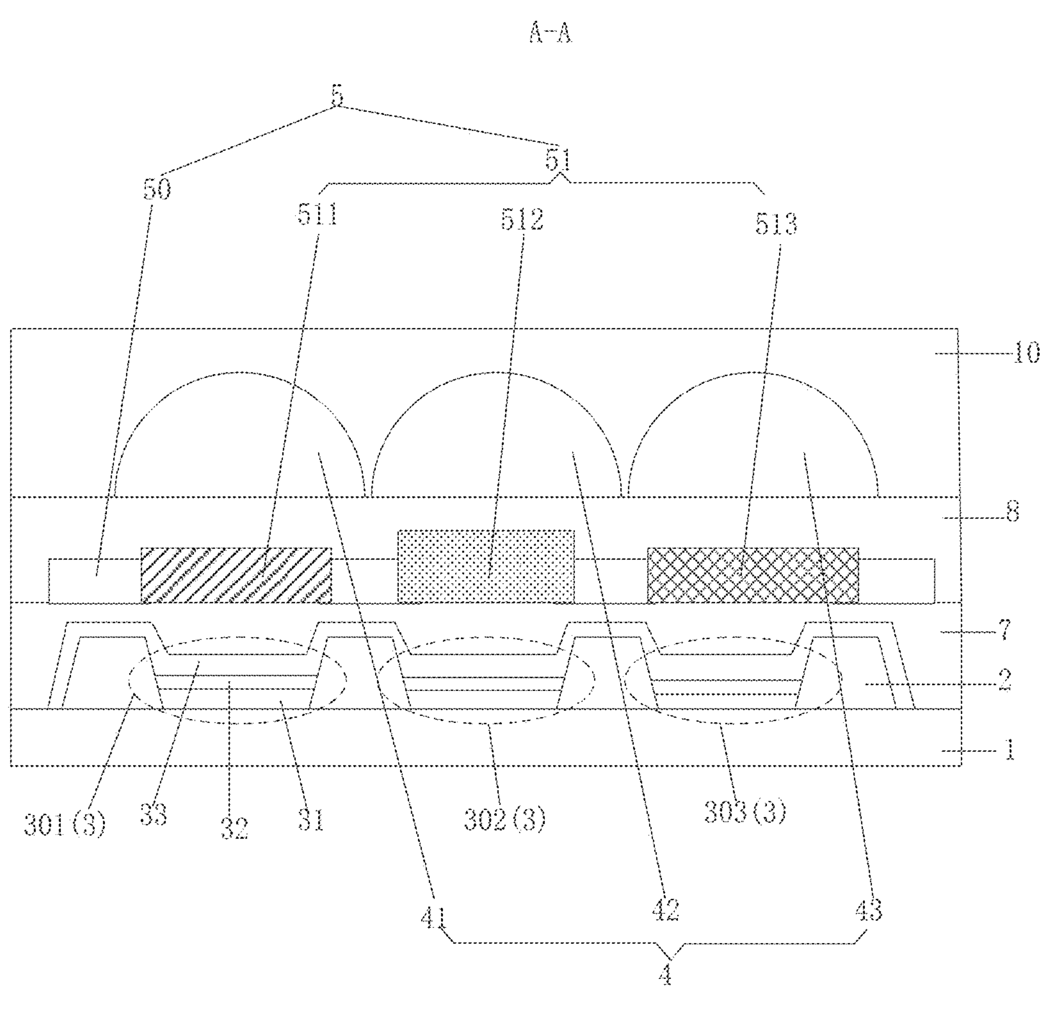
FIG. 2*d* is a cross-sectional view of another structure taken along a section line AA in FIG. 2*a*.
Figure 2E:
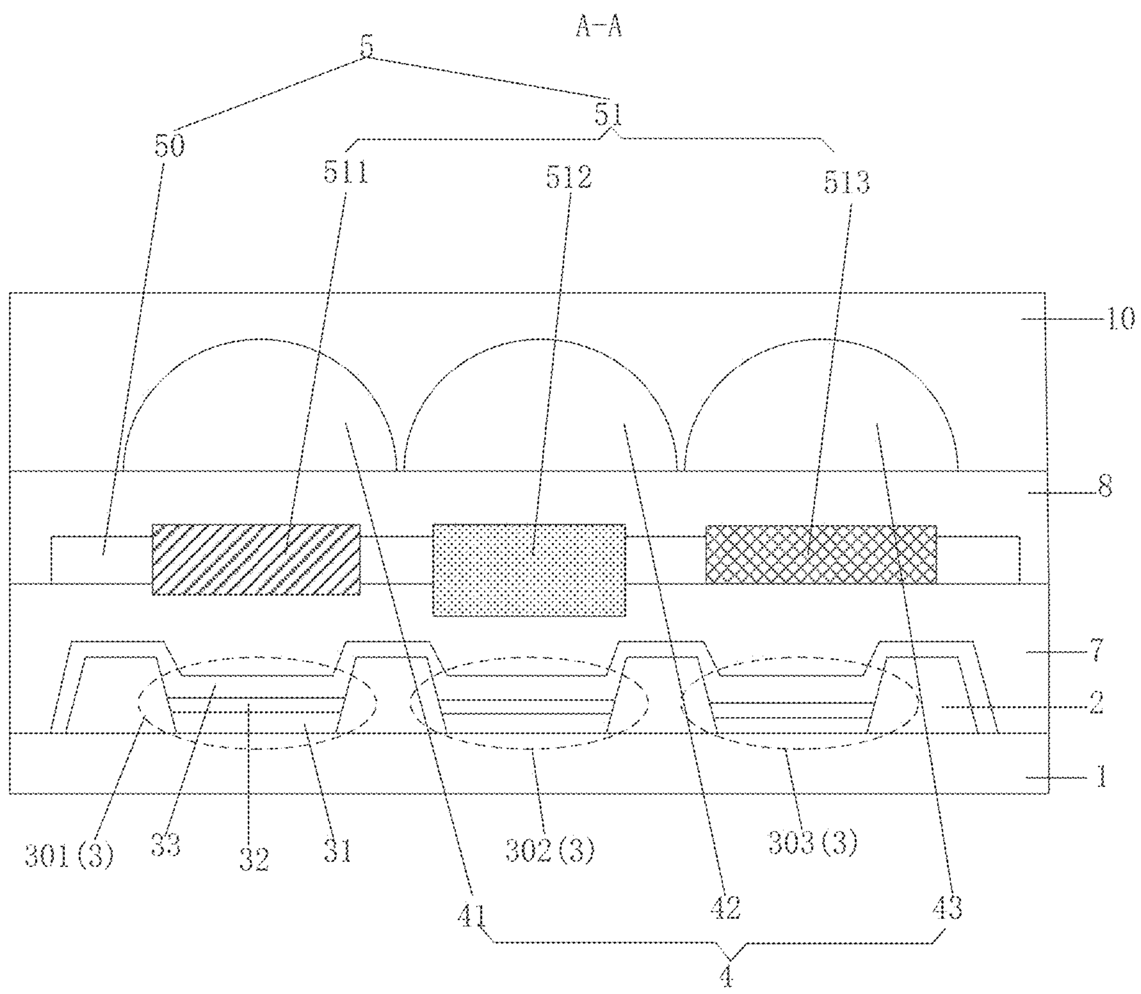
FIG. 2*e* is a cross-sectional view of yet another structure along a section line AA in FIG. 2*a*.
Figure 2F:
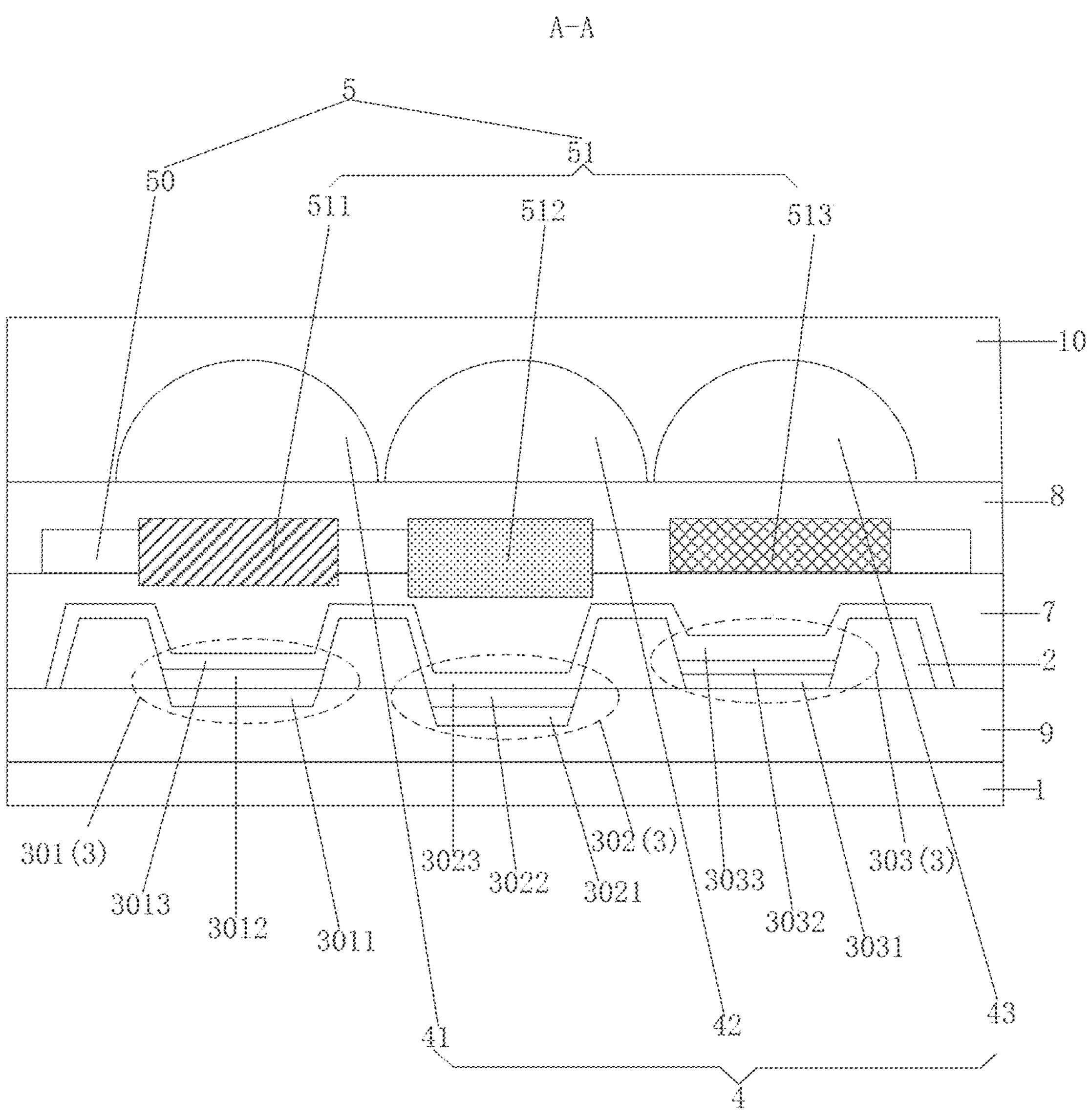
FIG. 2*f* is a cross-sectional view of yet another structure along a section line AA in FIG. 2*a*.

In some embodiments, FIG. 2*d* is a cross-sectional view of another structure taken along a section line AA in FIG. 2*a*. FIG. 2*e* is a cross-sectional view of yet another structure along a section line AA in FIG. 2*a*. FIG. 2*f* is a cross-sectional view of yet another structure along a section line AA in FIG. 2*a*. Referring to FIGS. 2*d*, 2*e* and 2*f*, the display panel further includes a color filter layer 5 located on a side of the plurality of sub-pixels 3 away from the driving back plate 1 and on a side of the plurality of micro-lens units 4 close to the driving back plate 1; the color filter layer 5 includes a black matrix 50 and a plurality of color filters 51 arranged in the same layer, and the plurality of color filters 51 and the plurality of sub-pixels 3 are in a one-to-one correspondence with each other; an orthographic projection of each color filter 51 on the driving back plate 1 covers an orthographic projection of the opening where the sub-pixel 3 corresponding to the color filter 51 is located on the driving back plate 1.

Figure 2G:
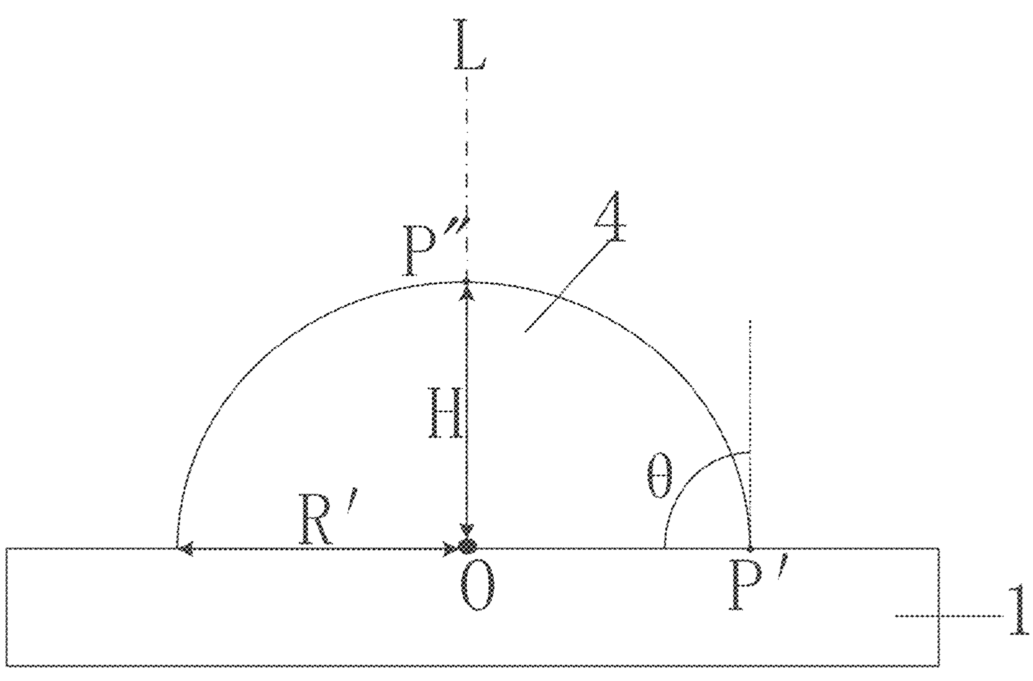
FIG. 2*g* is another schematic diagram of any cross section of a micro-lens unit perpendicular to a driving back plate and through a center of an orthographic projection of the micro-lens unit on the driving back plate according to embodiments of the present disclosure.

In some embodiments, FIG. 2*g* is another schematic diagram of any cross section of a micro-lens unit perpendicular to a driving back plate and through a center of an orthographic projection of the micro-lens unit on the driving back plate according to the embodiments of the present disclosure. Referring to FIGS. 2*b*, 2*d*, 20, 2*f* and 2*g*, a surface of each micro-lens unit 4 away from the driving back plate 1 is a circular arc surface, and the surface of the micro-lens unit 4 close to the driving back plate 1 is a plane. That is, the shape of the micro-lens unit 4 is a part of a sphere. The micro-lens unit 4 with such the shape can better inhibit the total reflection at an interface through which the sub-pixel 3 emits the light, and a light outgoing surface of the sub-pixel 3 is increased and the light at edges of the light outgoing surface of the sub-pixel 3 is accumulated inwards, which can extract more light, thereby increasing the light-emitting rate of the sub-pixel 3.

In some embodiments, referring to FIG. 2*g*, there is an angle θ in a range of 40° to 90° between a tangent line at an intersection point P' of the plane with the circular arc surface of the micro-lens unit 4 and the plane. The greater the angle θ is, the better the light extraction effect of the micro-lens unit 4 is, so as to facilitate increasing the light outgoing amount of the light outgoing surface of the sub-pixel 3 in a forward direction (i.e., a direction perpendicular to the light outgoing surface of the sub-pixel 3), and further increasing the light extraction efficiency of the sub-pixel 3. In some embodiments, when the angle θ between the tangent line at the intersection point P' of the plane with the circular arc surface of the micro-lens unit 4 and the plane is 90°, the shape of the micro-lens unit 4 is hemispherical, and the micro-lens unit 4 with the shape can further increase the light outgoing amount of the light outgoing surface of the sub-pixel 3 in the forward direction, thereby further increasing the light extraction efficiency of the sub-pixel 3.

In some embodiments, referring to FIG. 2*g*, a distance between a vertex P" of the circular arc surface and a center O of the plane is H, a radius of the plane is R', and H/R' is in a range of 0.4 to 1. The value of H/R' is closer to 1, which facilitates increasing the light outgoing amount of the light outgoing surface of the sub-pixel 3 in the forward direction (i.e., the direction perpendicular to the light outgoing surface of the sub-pixel 3), and further increasing the light extraction efficiency of the sub-pixel 3.

Figure 2H:
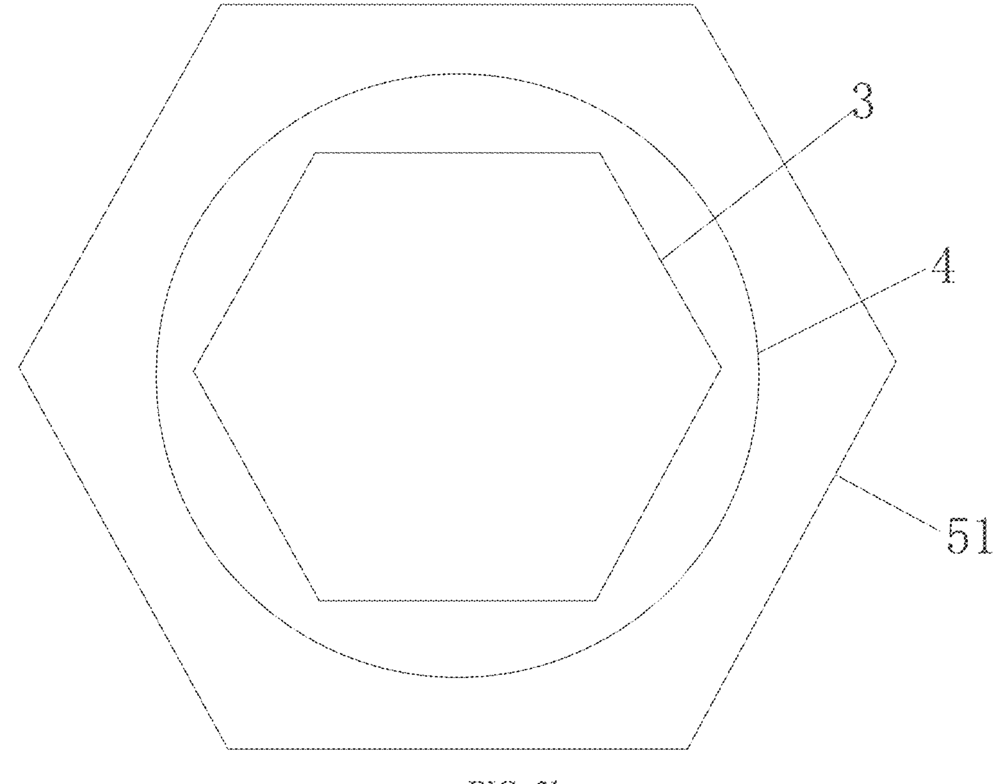
FIG. 2*h* is a schematic top view of a stacked structure of a color filter, a micro-lens unit and a sub-pixel according to embodiments of the present disclosure.

In some embodiments, FIG. 2*h* is a schematic top view of a stacked structure of a color filter, a micro-lens unit and a sub-pixel according to the embodiments of the present disclosure. Referring to FIG. 2*b* and FIG. 2*h*, an area of the orthographic projection of the micro-lens unit 4 on the driving back plate 1 is not less than that of an orthographic projection of the opening where the sub-pixel 3 corresponding to the micro-lens unit 4 is located on the driving back plate 1; and an area of the orthographic projection of the color filter 51 on the driving back plate 1 is not less than that of an orthographic projection of the micro-lens unit 4 corresponding to the color filter 51 on the driving back plate 1.

In some embodiments, referring to FIGS. 2*b* and 2*h*, the micro-lens unit 4 is provided on a side of the color filter layer 5 close to the sub-pixels 3, i.e., the micro-lens unit 4 is located between the color filter layer 5 and the sub-pixels 3, so that compared with the scheme of providing the color filter layer 5 between the driving back plate 1 and the micro-lens unit 4 in the related art, the phenomenon of the incomplete shape of the micro-lens unit 4 caused by a thickness difference among the color filters 51 with different colors in the color filter layer 5 can be eliminated or avoided. The light emitted by the sub-pixel 3 is converged and extracted by the micro-lens unit 4, and then is filtered through the color filter layer 5. In this way, the overlap between the color filter 51 and the black matrix 50 in the color filter layer 5 can be reduced, an effective aperture of the color filter 51 in the color filter layer 5 can be increased, thereby increasing the effective aperture of the sub-pixel 3, and then improving the life of the display panel, and enhancing the display performance of the display panel and the user experience.

Figure 2I:
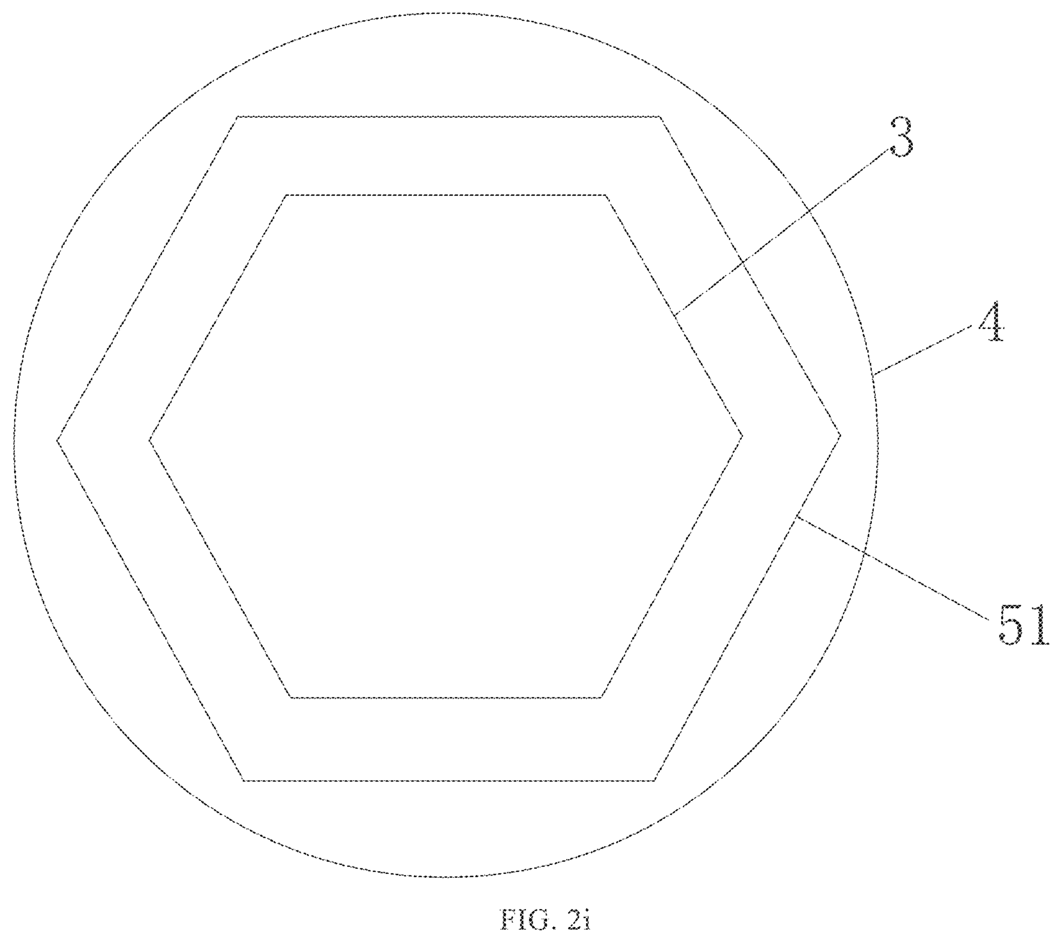
FIG. 2*i* is another schematic top view of a stacked structure of a micro-lens unit, a color filter, and a sub-pixel according to embodiments of the present disclosure.

In some embodiments, FIG. 2*i* is another schematic top view of a stacked structure of a micro-lens unit, a color filter, and a sub-pixel according to the embodiments of the present disclosure. Referring to FIG. 2*d*, FIG. 2*e*, FIG. 2*f* and FIG. 2*i*, an area of the orthographic projection of the color filter 51 on the driving back plate 1 is not less than that of an orthographic projection of the opening where the sub-pixel 3 corresponding to the color filter 51 is located on the driving back plate 1; and an area of the orthographic projection of the micro-lens unit 4 on the driving back plate 1 is not less than that of an orthographic projection of the color filter 51 corresponding to the micro-lens unit 4 on the driving back plate 1. Therefore, the phenomenon of the light leakage at the edge of the sub-pixel 3 can be eliminated or avoided, thereby eliminating or avoiding the phenomenon of the large viewing-angle chromatic aberration and the optical light leakage of the display panel, and improving the display effect of the display panel.

In some embodiments, referring to FIGS. 2*b*, 2*d*, 2*e* and 2*f*, the plurality of sub-pixels 3 includes a plurality of first sub-pixels 301, a plurality of second sub-pixels 302 and a plurality of third sub-pixels 303, which have different light-emitting colors; the plurality of color filters 51 include a plurality of first color filters 511, a plurality of second color filters 512 and a plurality of third color filters 513, which have different colors; the first sub-pixel 301 and the first color filter 511 correspond to each other, and have the same color; the second sub-pixel 302 and the second color filter 512 correspond to each other, and have the same color; the third sub-pixel 303 and the third color filter 513 correspond to each other, and have the same color; openings where the first sub-pixel 301, the second sub-pixel 302 and the third sub-pixel 303 are located have different opening areas; the first color filter 511, the second color filter 512 and the third color filter 513 have different thicknesses; the plurality of micro-lens units 4 include a plurality of first micro-lens units 41, a plurality of second micro-lens units 42, and a plurality of third micro-lens units 43, and the first sub-pixels 301 correspond to the first micro-lens units 41; the second sub-pixels 302 correspond to the second micro-lens units 42; the third sub-pixels 303 correspond to the third micro-lens units 43; the first micro-lens units 41, the second micro-lens units 42, and the third micro-lens units 43 are the same in size and shape.

In some embodiments, the first sub-pixel 301, the second sub-pixel 302, and the third sub-pixel 303 have the same light-emitting color.

In some embodiments, the first sub-pixel 301, the second sub-pixel 302, and the third sub-pixel 303 have the same thickness. The thickness of each of the first sub-pixel 301, the second sub-pixel 302, and the third sub-pixel 303 refers to the total thicknesses of the reflective anode 31, the light-emitting functional layer 32, and the cathode 33 of each sub-pixel 3.

In some embodiments, referring to FIG. 2*b*, the display panel further includes a first planarization layer 6 and an encapsulation layer 7, the encapsulation layer 7 is located on a side of the plurality of sub-pixels 3 away from the driving back plate 1 and on a side of the plurality of micro-lens units 4 close to the driving back plate 1, and surfaces of portions of the encapsulation layer 7 away from the driving back plate 1 are flush with each other; the first planarization layer 6 is located on a side of the micro-lens units 4 away from the driving back plate 1 and on a side of the color filter layer 5 close to the driving back plate 1, and surfaces of portions of the first planarization layer 6 away from the driving back plate 1 are flush with each other. The surfaces of portions of the encapsulation layer 7 away from the driving back plate 1 are flush with each other, so that it can be ensured that the shape of the micro-lens unit 4 formed on a side of the encapsulation layer 7 away from the driving back plate 1 is complete, thereby eliminating or avoiding the phenomenon of the light leakage at the edge of the sub-pixel 3 and further eliminating or avoiding the phenomenon of the large viewing-angle chromatic aberration and the optical light leakage of the display panel, and improving the display effect of the display panel.

In some embodiments, referring to FIG. 2*b*, the display panel further includes a protective layer 10 located on a side of the color filter layer 5 away from the driving back plate 1 for protecting the color filter layer 5.

In some embodiments, referring to FIG. 2*b*, a refractive index of the encapsulation layer 7 is the same as the micro-lens unit 4. It is known that the greater a difference between the refractive indexes of the encapsulation layer 7 and the micro-lens unit 4 is, the smaller the light outgoing amount of the sub-pixel 3 is. Therefore, with such a configuration, the light outgoing amount of the sub-pixel 3 can be improved, thereby improving the light extraction efficiency of the sub-pixel 3; the refractive index of the micro-lens unit 4 is greater than that of the first planarization layer 6; the refractive index of the micro-lens unit 4 is n2, the refractive index of the first planarization layer 6 is n3, and $n2-n3>0.09$.

In some embodiments, $n2-n3>0.14$. In some embodiments, $n2-n3>0.3$. The greater the difference between the refractive index of the micro-lens unit 4 and the refractive index of the first planarization layer 6 is, the greater the inward accumulation of the micro-lens unit 4 to the light emitted by the sub-pixel 3 is, so that the light outgoing surface of the sub-pixel 3 can be further increased, and the light outgoing amount of the sub-pixel 3 can be further increased.

In some embodiments, referring to FIG. 2*b*, $f=(n3\times R1)/(n2-n3)$; $f=h\times n1$; where f is a focal length of the micro-lens unit 4; R1 is a radius of the circular arc surface of the micro-lens unit 4 away from the driving back plate 1; h is the thickness of the encapsulation layer 7; n1 is the refractive index of the encapsulation layer 7. With such a configuration, a focus of the micro-lens unit 4 is located on the light outgoing surface of the sub-pixel 3, so that the micro-lens unit 4 can further increase the light outgoing amount of the sub-pixel 3.

In some embodiments, the encapsulation layer 7 includes two inorganic layers and one organic layer, and the focal length of the micro-lens unit 4 is equal to a thickness×a refractive index of one of the inorganic layers+a thickness×a refractive index of the other one of the inorganic layers+a thickness×a refractive index of the organic layer.

In some embodiments, referring to FIG. 2*d*, the display panel further includes an encapsulation layer 7 and a second planarization layer 8; the encapsulation layer 7 is located on a side of the plurality of sub-pixels 3 away from the driving back plate 1 and on a side of the color filter layer 5 close to the driving back plate 1; the second planarization layer 8 is located on a side of the color filter layer 5 away from the driving back plate 1 and on a side of the micro-lens unit 4 close to the driving back plate 1, and surfaces of portions of the encapsulation layer 7 away from the driving back plate 1 are flush with each other; surfaces of portions of the second planarization layer 8 in contact with the (corresponding) first micro-lens unit 41, the second micro-lens unit 42, and the third micro-lens unit 43 are flush with each other; the portions of the second planarization layer 8 in contact with the first micro-lens unit 41, the second micro-lens unit 42, and the third micro-lens unit 43 have different thicknesses.

In this embodiment, referring to FIG. 2*d*, a groove or a protrusion may be formed on a surface of the second planarization layer 8 in contact with any one of the first micro-lens unit 41, the second micro-lens unit 42, and the third micro-lens unit 43, so that portions of the second planarization layer 8 in contact with the first micro-lens unit 41, the second micro-lens unit 42, and the third micro-lens unit 43 have different thicknesses, to compensate for a difference among thicknesses of the first color filter 511, the second color filter 512, and the third color filter 513, so that surface areas of the portions of the second planarization layer 8 in contact with the first micro-lens unit 41, the second micro-lens unit 42, and the third micro-lens unit 43 are flush with each other, and thus, the shape of each of the first micro-lens unit 41, the second micro-lens unit 42, and the third micro-lens unit 43 formed on a side of the second planarization layer 8 away from the color filter layer 5 is complete, thereby eliminating or avoiding the phenomenon of the light leakage at the edge of the sub-pixel 3 and further eliminating or avoiding the phenomenon of the large viewing-angle chromatic aberration and the optical light leakage of the display panel, and improving the display effect of the display panel.

In some embodiments, referring to FIG. 2*d*, an average value of the thicknesses of the first color filter 511, the second color filter 512 and the third color filter 513 is a first average value, and the difference among the thicknesses of the portions of the second planarization layer 8 in contact with the first micro-lens unit 41, the second micro-lens unit 42 and the third micro-lens unit 43 is a difference among a difference between the thickness of the first color filter 511 and the first average value, a difference between the thickness of the second color filter 512 and the first average value and a difference between the thickness of the third color filter 513 and the first average value.

Referring to FIG. 2*d*, the groove or the protrusion may be formed on the surface of the second planarization layer 8 in contact with any one of the first micro-lens unit 41, the second micro-lens unit 42, and the third micro-lens unit 43, so that the portions of the second planarization layer 8 in contact with the first micro-lens unit 41, the second micro-lens unit 42, and the third micro-lens unit 43 have different thicknesses, to compensate for the difference among the difference between the thickness of the first color filter 511 and the first average value, the difference between the thickness of the second color filter 512 and the first average value and the difference between the thickness of the third color filter 513 and the first average value, so that the surface areas of the portions of the second planarization layer 8 in contact with the first micro-lens unit 41, the second micro-lens unit 42, and the third micro-lens unit 43 are flush with each other, and thus, the shape of each of the first micro-lens unit 41, the second micro-lens unit 42, and the third micro-lens unit 43 formed on a side of the second planarization layer 8 away from the color filter layer 5 is complete.

In some embodiments, referring to FIG. 2*d*, the difference between the thicknesses of the portions of the second planarization layer 8 in contact with the first micro-lens unit 41 and the second micro-lens unit 42 is a difference between the thicknesses of the first color filter 511 and the second color filter 522; the difference between the thicknesses of the portions of the second planarization layer 8 in contact with the first micro-lens unit 41 and the third micro-lens unit 43 is a difference between the thicknesses of the first color filter 511 and the third color filter 513.

The groove or the protrusion may be formed on a surface of the second planarization layer 8 in contact with the second micro-lens unit 42, and the third micro-lens unit 43, so that the surfaces of the portions of the second planarization layer 8 in contact with the second micro-lens unit 42 and the third micro-lens unit 43 are flush with the surface of the portion of the second planarization layer 8 in contact with the first micro-lens unit 41, to compensate for the difference between the thicknesses of the first color filter 511 and the second color filter 522 and the difference between the thicknesses of the first color filter 511 and the third color filter 513, so that the surface areas of the portions of the second planarization layer 8 in contact with the first micro-lens unit 41, the second micro-lens unit 42, and the third micro-lens unit 43 are flush with each other, and thus, the shape of each of the first micro-lens unit 41, the second micro-lens unit 42, and the third micro-lens unit 43 formed on a side of the second planarization layer 8 away from the color filter layer 5 is complete.

In some embodiments, referring to FIG. 2*e*, the display panel further includes an encapsulation layer 7 and a second planarization layer 8; the encapsulation layer 7 is located on a side of the plurality of sub-pixels 3 away from the driving back plate 1 and on a side of the color filter layer 5 close to the driving back plate 1; the second planarization layer 8 is located on a side of the color filter layer 5 away from the driving back plate 1 and on a side of the micro-lens unit 4 close to the driving back plate 1; and portions of the encapsulation layer 7 in contact with the first color filter 511, the second color filter 512, and the third color filter 513 have different thicknesses; surfaces of portions of the first color filter 511, the second color filter 512, and the third color filter 513 away from the driving back plate 1 are flush with each other; surfaces of portions of the second planarization layer 8 away from the driving back plate 1 are flush with each other.

In this embodiment, referring to FIG. 2*e*, a groove or a protrusion may be formed on a surface of the encapsulation layer 7 in contact with any one of the first color filter 511, the second color filter 512, and the third color filter 513, so that the portions of the encapsulation layer 7 in contact with the first color filter 511, the second color filter 512, and the third color filter 513 have different thicknesses, to compensate for a difference among thicknesses of the first color filter 511, the second color filter 512, and the third color filter 513, so that the surfaces of the portions of the first color filter 511, the second color filter 512, and the third color filter 513 away from the driving back plate 1 are flush with each other, and the surfaces of the portions of the second planarization layer 8 away from the driving back plate 1 are flush with each other, and thus, the shape of each of the first micro-lens unit 41, the second micro-lens unit 42, and the third micro-lens unit 43 formed on a side of the second planarization layer 8 away from the color filter layer 5 is complete, thereby eliminating or avoiding the phenomenon of the light leakage at edges of the sub-pixel 3 and further eliminating or avoiding the phenomenon of the large viewing angle chromatic aberration and the optical light leakage of the display panel, and improving the display effect of the display panel.

In some embodiments, referring to FIG. 2*e*, an average value of the thicknesses of the first color filter 511, the second color filter 512 and the third color filter 513 is a first average value, and the difference among the thicknesses of the portions of the encapsulation layer 7 in contact with the first color filter 511, the second color filter 512, and the third color filter 513 is a difference among a difference between the thickness of the first color filter 511 and the first average value, a difference between the thickness of the second color filter 512 and the first average value and a difference between the thickness of the third color filter 513 and the first average value.

Referring to FIG. 2*e*, the groove or the protrusion may be formed on a surface of the encapsulation layer 7 in contact with any one of the first color filter 511, the second color filter 512, and the third color filter 513, so that the portions of the encapsulation layer 7 in contact with the first color filter 511, the second color filter 512, and the third color filter 513 have different thicknesses, to compensate for the difference among the difference between the thickness of the first color filter 511 and the first average value, the difference between the thickness of the second color filter 512 and the first average value and the difference between the thickness of the third color filter 513 and the first average value, so that the surfaces of the portions of the first color filter 511, the second color filter 512, and the third color filter 513 away from the driving back plate 1 are flush with each other, and the surfaces of the portions of the second planarization layer 8 away from the driving back plate 1 are flush with each other, and thus, the shape of each of the first micro-lens unit 41, the second micro-lens unit 42, and the third micro-lens unit 43 formed on a side of the second planarization layer 8 away from the color filter layer 5 is complete.

In some embodiments, referring to FIG. 2*e*, the difference between the thicknesses of the portions of the encapsulation layer 7 in contact with the first color filter 511 and the second color filter 512 is a difference between the thicknesses of the first color filter 511 and the second color filter 522; the difference between the thicknesses of the portions of the encapsulation layer 7 in contact with the first color filter 511 and the third color filter 513 is a difference between the thicknesses of the first color filter 511 and the third color filter 513.

The groove or the protrusion may be formed on a surface of the encapsulation layer 7 in contact with the second color filter 512 and the third color filter 513, so that the surfaces of the portions of the second color filter 512, and the third color filter 513 away from the driving back plate 1 are flush with the surface of the portion of the first color filter 511 away from the driving back plate 1, to compensate for the difference between the thicknesses of the first color filter 511 and the second color filter 512, and the difference between the thicknesses of the first color filter 511 and the third color filter 513, so that the surfaces of the portions of the first color filter 511, the second color filter 512, and the third color filter 513 away from the driving back plate 1 are flush with each other, and the surfaces of the portions of the second planarization layer 8 away from the driving back plate 1 are flush with each other, and thus, the shape of each of the first micro-lens unit 41, the second micro-lens unit 42, and the third micro-lens unit 43 formed on a side of the second planarization layer 8 away from the color filter layer 5 is complete.

In some embodiments, referring to FIG. 2*f*, the display panel further includes an encapsulation layer 7, a second planarization layer 8 and a third planarization layer 9; the encapsulation layer 7 is located on a side of the plurality of sub-pixels 3 away from the driving back plate 1 and on a side of the color filter layer 5 close to the driving back plate 1, the second planarization layer 8 is located on a side of the color filter layer 5 away from the driving back plate 1 and on a side of the micro-lens unit 4 close to the driving back plate 1, the third planarization layer 9 is located on a side of the plurality of sub-pixels 3 close to the driving back plate 1 and on a side of the driving back plate 1 close to the plurality of sub-pixels 3; each first sub-pixel 301 includes a first anode 3011, a first light-emitting functional layer 3012 and a first cathode 3013 sequentially stacked in a direction away from the third planarization layer 9; each second sub-pixel 302 includes a second anode 3021, a second light-emitting functional layer 3022 and a second cathode 3023 sequentially stacked in a direction away from the third planarization layer 9; each third sub-pixel 303 includes a third anode 3031, a third light-emitting functional layer 3032 and a third cathode 3033 sequentially stacked in a direction away from the third planarization layer 9; portions of the third planarization layer 9 in contact with the first anode 3011, the second anode 3021 and the third anode 3031 have different thicknesses; the portions of the encapsulation layer 7 in contact with the first color filter 511, the second color filter 512 and the third color filter 513 have the same thickness; the surfaces of the portions of the first color filter 511, the second color filter 512, and the third color filter 513 away from the driving back plate 1 are flush with each other, and the surfaces of the portions of the second planarization layer 8 away from the driving back plate 1 are flush with each other.

In this embodiment, referring to FIG. 2*f*, a groove or a protrusion may be formed on a surface of the third planarization layer 9 in contact with any one of the first anode 3011, the second anode 3021 and the third anode 3031, so that the portions of the third planarization layer 9 in contact with the first anode 3011, the second anode 3021 and the third anode 3031 have different thicknesses, to compensate for a difference among thicknesses of the first color filter 511, the second color filter 512, and the third color filter 513, so that the surfaces of the portions of the second planarization layer 8 away from the driving back plate 1 are flush with each other, and therefore the shape of each of the first micro-lens unit 41, the second micro-lens unit 42, and the third micro-lens unit 43 formed on a side of the second planarization layer 8 away from the color filter layer 5 is complete, thereby eliminating or avoiding the phenomenon of the light leakage at the edge of the sub-pixel 3 and further eliminating or avoiding the phenomenon of the large viewing-angle chromatic aberration and the optical light leakage of the display panel, and improving the display effect of the display panel.

In some embodiments, referring to FIG. 2*f*, an average value of the thicknesses of the first color filter 511, the second color filter 512 and the third color filter 513 is a first average value, and the difference among the thicknesses of the portions of the third planarization layer 9 in contact with the first anode 3011, the second anode 3021 and the third anode 3031 is a difference among a difference between the thickness of the first color filter 511 and the first average value, a difference between the thickness of the second color filter 512 and the first average value and a difference between the thickness of the third color filter 513 and the first average value.

Referring to FIG. 2*f*, the groove or the protrusion may be formed on the surface of the third planarization layer 9 in contact with any one of the first anode 3011, the second anode 3021 and the third anode 3031, so that the portions of the third planarization layer 9 in contact with the first anode 3011, the second anode 3021 and the third anode 3031 have different thicknesses, to compensate for the difference among the difference between the thickness of the first color filter 511 and the first average value, the difference between the thickness of the second color filter 512 and the first average value and the difference between the thickness of the third color filter 513 and the first average value, so that the surfaces of the portions of the first color filter 511, the second color filter 512, and the third color filter 513 away from the driving back plate 1 are flush with each other, and the surfaces of the portions of the second planarization layer 8 away from the driving back plate 1 are flush with each other, and thus, the shape of each of the first micro-lens unit 41, the second micro-lens unit 42, and the third micro-lens unit 43 formed on a side of the second planarization layer 8 away from the color filter layer 5 is complete.

In some embodiments, referring to FIG. 2*f*, the difference between the thicknesses of the portions of the third planarization layer 9 in contact with the first anode 3011 and the second anode 3021 is a difference between the thicknesses of the first color filter 511 and the second color filter 522; the difference between the thicknesses of the portions of the third planarization layer 9 in contact with the first anode 3011 and the third anode 3031 is a difference between the thicknesses of the first color filter 511 and the third color filter 513.

The groove or the protrusion may be formed on a surface of the third planarization layer 9 in contact with the second anode 3021 and the third anode 3031, so that the surfaces of the portions of the second color filter 512, and the third color filter 513 away from the driving back plate 1 are flush with the surface of the portion of the first color filter 511 away from the driving back plate 1, to compensate for the difference between the thicknesses of the first color filter 511 and the second color filter 512, and the difference between the thicknesses of the first color filter 511 and the third color filter 513, so that the surfaces of the portions of the first color filter 511, the second color filter 512, and the third color filter 513 away from the driving back plate 1 are flush with each other, and the surfaces of the portions of the second planarization layer 8 away from the driving back plate 1 are flush with each other, and thus, the shape of each of the first micro-lens unit 41, the second micro-lens unit 42, and the third micro-lens unit 43 formed on a side of the second planarization layer 8 away from the color filter layer 5 is complete.

In some embodiments, referring to FIGS. 2*d*, 2*e* and 2*f*, the display panel further includes a protective layer 10 on a side of the micro-lens unit 4 away from the driving back plate 1; the second planarization layer 8 has the same refractive index as the micro-lens unit 4. It is known that the greater a difference between the refractive indexes of the second planarization layer 8 and the micro-lens unit 4 is, the smaller the light outgoing amount of the sub-pixel 3 is. Therefore, with such a configuration, the light outgoing amount of the sub-pixel 3 can be improved, thereby improving the light extraction efficiency of the sub-pixel 3; the refractive index of the micro-lens unit 4 is greater than that of the protective layer 10; the refractive index of the micro-lens unit 4 is n2, the refractive index of the protective layer 10 is n4, and $n2-n4>0.09$.

In some embodiments, $n2-n4>0.14$. In some embodiments, $n2-n4>0.3$. The greater the difference between the refractive index of the micro-lens unit 4 and the refractive index of the protective layer 10 is, the greater the inward accumulation of the micro-lens unit 4 to the light emitted by the sub-pixel 3 is, so that the light outgoing surface of the sub-pixel 3 can be further increased, and the light outgoing amount of the sub-pixel 3 can be further increased.

In some embodiments, $f=(n4\times R1)/(n2-n4)$; $f=h1\times n5+h2\times n6+h3\times n7$; where f is a focal length of the micro-lens unit 4;

R1 is a radius of the circular arc surface of the micro-lens unit 4 away from the driving back plate 1; h1 is the thickness of the second planarization layer 8; n5 is the refractive index of the second planarization layer 8; h2 is a thickness of the color filter 51 corresponding to the micro-lens unit 4; n6 is a refractive index of the color filter 51 corresponding to the micro-lens unit 4; h3 is a thickness of a portion of the encapsulation layer 7 corresponding to the micro-lens unit 4; n7 is a refractive index of the portion of the encapsulation layer 7 corresponding to the micro-lens unit 4. With such a configuration, a focus of the micro-lens unit 4 is located on the light outgoing surface of the sub-pixel 3, so that the micro-lens unit 4 can further increase the light outgoing amount of the sub-pixel 3.

In some embodiments, referring to FIGS. 2*b*, 2*d*, 2*e* and 2*f*, the micro-lens unit 4 includes a micro-lens, and a duty ratio of the micro-lens in an area of an orthographic projection of an opening where the sub-pixel 3 is located on the driving back plate 1 is 100%.

Figure 3:
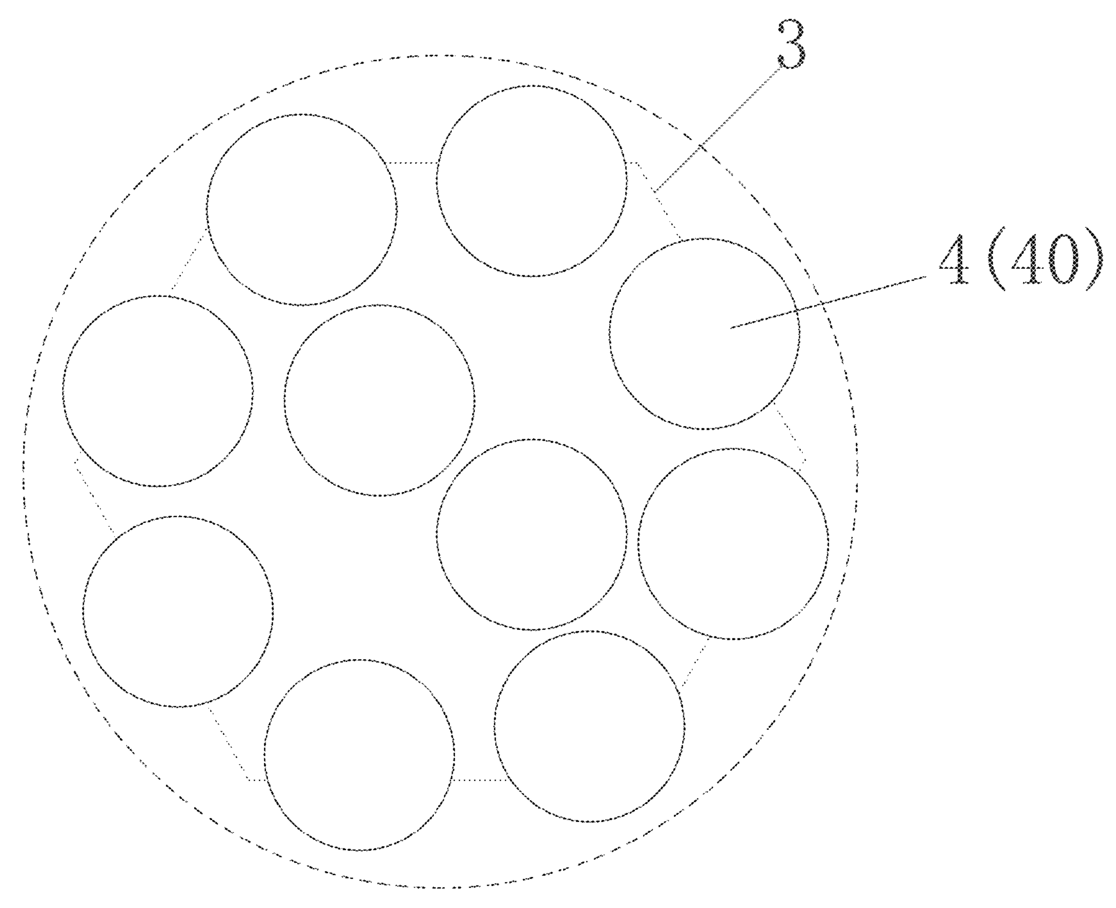
FIG. 3 is a schematic top view of a micro-lens unit corresponding to a sub-pixel according to embodiments of the present disclosure.

In some embodiments, FIG. 3 is a schematic top view of a micro-lens unit corresponding to a sub-pixel according to embodiments of the present disclosure. Referring to FIG. 3, the micro-lens unit 4 includes a plurality of micro-lenses 40, and a duty ratio of the plurality of micro-lenses 40 in an area of an orthographic projection of an opening where the sub-pixel 3 is located on the driving back plate 1 is more than 70%. The greater a distribution density of the micro-lenses 40 in the area of the orthographic projection of the opening where the sub-pixel 3 is located on the driving back plate 1 is, the greater the light extraction amount of the sub-pixel 3 is, and the better the light extraction effect is.

Figure 4A:
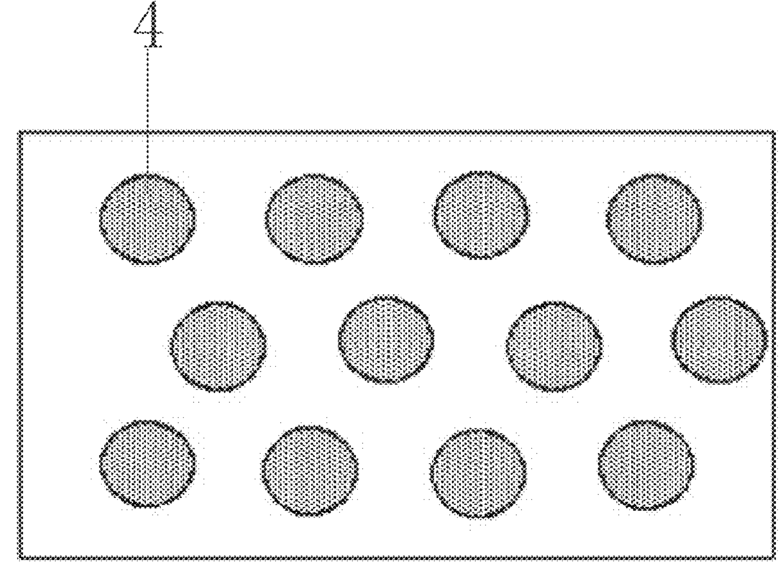
FIG. 4*a* is a schematic top view illustrating a layout of micro-lens units according to embodiments of the present disclosure.
Figure 4B:
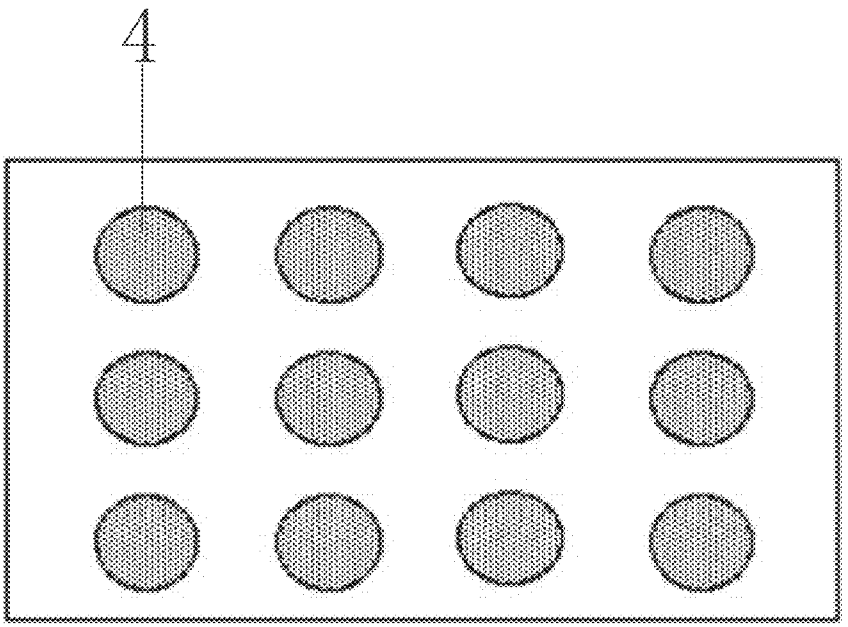
FIG. 4*b* is a schematic top view of a layout of micro-lens units according to embodiments of the present disclosure.

In some embodiments, FIG. 4*a* is a schematic top view illustrating a layout of micro-lens units according to embodiments of the present disclosure. FIG. 4*b* is a schematic top view of another layout of micro-lens units according to embodiments of the present disclosure. Referring to FIGS. 4*a* and 4*b*, the plurality of sub-pixels are arranged in an array, and the plurality of micro-lens units 4 are arranged in an array. In FIG. 4*a*, the micro-lens units 4 are arranged in a honeycomb array; in FIG. 4*b*, the micro-lens units 4 are arranged in an orthogonal array.

In some embodiments, a radial size of the opening in which the sub-pixel 3 is located is 10 μm or less. That is, the sub-pixel 3 in this embodiment is a silicon-based micro OLED (organic light-emitting diode) device.

In the display panel provided by the embodiments of the present disclosure, the micro-lens units are disposed on a side (i.e., a light outgoing side) of the sub-pixels away from the driving back plate, and a surface (i.e., a light outgoing surface) of each micro-lens unit away from the driving back plate is an uneven surface, so that the total reflection at an interface through which the sub-pixel emits light can be inhibited, and a light outgoing surface of the sub-pixel is increased and the light at an edge of the light outgoing surface of the sub-pixel is accumulated inwards, which can extract more light, thereby increasing the light-emitting efficiency of the sub-pixel. The pattern of each micro-lens unit is axisymmetric with respect to an axis in any cross section which is perpendicular to the driving back plate and passes through the center of the orthographic projection of the micro-lens unit on the driving back plate; the axis is a straight line which passes through the center of the orthographic projection of the micro-lens unit on the driving back plate and is perpendicular to the driving back plate; in any cross section of the micro-lens unit which is perpendicular to the driving back plate and passes through the center of the orthographic projection of the micro-lens unit on the driving back plate, the distance from any point on a side of the micro-lens unit away from the driving back plate to the center of the orthographic projection of the micro-lens unit on the driving back plate is D, the length of a side of the micro-lens unit close to the driving back plate is 2R, and $0.9 \leq D/R \leq 1.0$. In this way, it can be ensured that the shape of the micro-lens unit in the display panel is complete, thereby eliminating or avoiding the phenomenon of the light leakage at the edge of the sub-pixel and further eliminating or avoiding the phenomenon of the large viewing-angle chromatic aberration and the optical light leakage of the display panel, and improving the display effect of the display panel.

In a second aspect, embodiments of the present disclosure further provide a method for manufacturing the display panel, including the following steps:

Step S01: forming a driving back plate.

In this step, pixel circuits in the driving back plate are formed by a conventional patterning process (including steps of film formation, exposure, development, etching, and the like), which is not described here again.

Step S02: forming a pixel defining layer on a side of the driving back plate and forming a plurality of openings in the pixel defining layer.

In this step, the pixel defining layer is formed by a conventional patterning process (including steps of film formation, exposure, development, and the like), and the specific process is not described in detail.

Step S03: forming a plurality of sub-pixels; where the plurality of sub-pixels are respectively located in different openings.

In this step, a reflective anode of each sub-pixel is formed by a conventional patterning process; a light-emitting functional layer of each sub-pixel is formed by an evaporation process; and a cathode of each sub-pixel is formed by an evaporation process.

Step S04: forming a plurality of micro-lens units on a side of the plurality of sub-pixels away from the driving back plate.

In this step, the micro-lens units may be made of a polyimide material or an acrylic resin material. The micro-lens units are formed by a printing process, or by coating a film layer followed by an exposure process. The specific process is a conventional technology and is not described in detail.

The plurality of micro-lens units are in a one-to-one correspondence with the plurality of sub-pixels, an orthographic projection of each micro-lens unit on the driving back plate covers an orthographic projection of the opening where the sub-pixel corresponding to the micro-lens unit is located on the driving back plate; a pattern of each micro-lens unit is axisymmetric with respect to an axis in any cross section which is perpendicular to the driving back plate and passes through a center of the orthographic projection of the micro-lens unit on the driving back plate; the axis is a straight line which passes through the center of the orthographic projection of the micro-lens unit on the driving back plate and is perpendicular to the driving back plate; in any cross section of the micro-lens unit which is perpendicular to the driving back plate and passes through the center of the orthographic projection of the micro-lens unit on the driving back plate, a distance from any point on a side of the micro-lens unit away from the driving back plate to the center of the orthographic projection of the micro-lens unit on the driving back plate is D, a length of a side of the micro-lens unit close to the driving back plate is 2R, and $0.9 \leq D/R \leq 1.0$.

In some embodiments, the method for manufacturing the display panel in FIG. 2*b* further includes forming a color filter layer on a side of the micro-lens units away from the driving back plate. The color filter layer is formed by a conventional exposure process.

In some embodiments, the method for manufacturing the display panel in FIG. 2*d* further includes forming a color filter layer on a side of the micro-lens units close to the driving back plate and on a side of the sub-pixels away from the driving back plate; and forming a second planarization layer on a side of the color filter layer away from the driving back plate, and on a side of the micro-lens units close to the driving back plate. The step of forming the second planarization layer includes forming a pattern of the second planarization layer by a halftone exposure process and forming a groove or a protrusion on a side of the second planarization layer away from the driving back plate.

In some embodiments, the method for manufacturing the display panel in FIG. 2*c* further includes forming a color filter layer on a side of the micro-lens units close to the driving back plate and on a side of the sub-pixels away from the driving back plate; and forming an encapsulation layer on a side of the color filter layer close to the driving back plate and on a side of the sub-pixels away from the driving back plate. The step of forming the encapsulation layer includes forming a pattern of the encapsulation layer by a halftone exposure process and forming a groove or a protrusion on a side of the encapsulation layer away from the driving back plate.

In some embodiments, the method for manufacturing the display panel in FIG. 2*f* further includes forming a color filter layer on a side of the micro-lens units close to the driving back plate and on a side of the sub-pixels away from the driving back plate; and forming a third planarization layer on a side of the sub-pixels close to the driving back plate and on a side of the driving back plate close to the sub-pixels. The step of forming the third planarization layer includes forming a pattern of the third planarization layer by a halftone exposure process and forming a groove or a protrusion on a side of the third planarization layer away from the driving back plate.

The method for manufacturing the display panel in the embodiments of the present disclosure is simple, can be realized through a conventional process, and does not additionally increase the cost of the procedure for manufacturing the display panel.

In a third aspect, embodiments of the present disclosure further provide a display apparatus, which includes the display panel in the foregoing embodiments.

By adopting the display panel in the above embodiments, the light extraction efficiency of the display apparatus can be improved, the phenomenon of the large viewing-angle chromatic aberration and the optical light leakage of the display apparatus can be eliminated or avoided, and the display effect of the display apparatus can be improved and therefore the user experience can be enhanced.

The display apparatus may be an AR (augmented reality) or VR (virtual reality) display apparatus.

The display apparatus provided by the embodiments of the present disclosure may be any product or component with a display function, such as an OLED panel, an OLED television, an OLED billboard, a display, a mobile phone, or a navigator or the like.

It should be understood that, the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A display panel, comprising a driving back plate, a pixel defining layer, a plurality of sub-pixels and a plurality of micro-lens units, wherein the pixel defining layer is on a side of the driving back plate, and comprises a plurality of openings therein, the plurality of sub-pixels are in different openings of the plurality of openings, respectively;

the plurality of micro-lens units are on a side of the plurality of sub-pixels away from the driving back plate, and are in a one-to-one correspondence with the plurality of sub-pixels, an orthographic projection of each micro-lens unit on the driving back plate covers an orthographic projection of an opening where the sub-pixel corresponding to the micro-lens unit is located on the driving back plate;

a pattern of each micro-lens unit, in any cross section which is perpendicular to the driving back plate and passes through a center of the orthographic projection of the micro-lens unit on the driving back plate, is axisymmetric with respect to an axis; the axis is a straight line which passes through the center of the orthographic projection of the micro-lens unit on the driving back plate and is perpendicular to the driving back plate;

in any cross section of the micro-lens unit which is perpendicular to the driving back plate and passes through the center of the orthographic projection of the micro-lens unit on the driving back plate, a distance from any point on a side of the micro-lens unit away from the driving back plate to the center of the orthographic projection of the micro-lens unit on the driving back plate is D, a length of a side of the micro-lens unit close to the driving back plate is 2R, and $0.9 \le D/R \le 1.0$.

2. The display panel of claim 1, further comprising a color filter layer on a side of the plurality of micro-lens units away from the driving back plate;

the color filter layer comprises a black matrix and a plurality of color filters, the black matrix and the plurality of color filters are arranged in a same layer, the plurality of color filters are in a one-to-one correspondence with the plurality of sub-pixels; and an orthographic projection of each color filter on the driving back plate covers an orthographic projection of an opening where the sub-pixel corresponding to the color filter is located on the driving back plate.

3. The display panel of claim 2, wherein an area of an orthographic projection of each micro-lens unit on the driving back plate is not less than that of an orthographic projection of an opening where the sub-pixel corresponding to the micro-lens unit is located on the driving back plate; and an area of an orthographic projection of each color filter on the driving back plate is not less than that of an orthographic projection of the micro-lens unit corresponding to the color filter on the driving back plate.

4. The display panel of claim 2, further comprising a first planarization layer and an encapsulation layer, wherein the encapsulation layer is on a side of the plurality of sub-pixels away from the driving back plate and on a side of the plurality of micro-lens units close to the driving back plate, surfaces of portions of the encapsulation layer away from the driving back plate are flush with each other;

the first planarization layer is on a side of the plurality of micro-lens units away from the driving back plate and on a side of the color filter layer close to the driving back plate, and surfaces of portions of the first planarization layer away from the driving back plate are flush with each other.

5. The display panel of claim 4, wherein the encapsulation layer has a same refractive index as each micro-lens unit;

the refractive index of each micro-lens unit is greater than that of the first planarization layer;

the refractive index of each micro-lens unit is n2, and the refractive index of the first planarization layer is n3, and $n2-n3>0.09$; and wherein $f=(n3-R1)/(n2-n3)$;

$f=h\times n1$;

where f is a focal length of each micro-lens unit; R1 is a radius of a circular arc surface of each micro-lens unit away from the driving back plate; h is a thickness of the encapsulation layer; and n1 is the refractive index of the encapsulation layer.

6. The display panel of claim 1, further comprising a color filter layer on a side of the plurality of sub-pixels away from the driving back plate and on a side of the plurality of micro-lens units close to the driving back plate;

the color filter layer comprises a black matrix and a plurality of color filters, the black matrix and the plurality of color filters are arranged in a same layer, the plurality of color filters are in a one-to-one correspondence with the plurality of sub-pixels; and an orthographic projection of each color filter on the driving back plate covers an orthographic projection of an opening where the sub-pixel corresponding to the color filter is located on the driving back plate.

7. The display panel of claim 6, wherein an area of an orthographic projection of each color filter on the driving back plate is not less than that of an orthographic projection of an opening where the sub-pixel corresponding to the color filter is located on the driving back plate; and an area of an orthographic projection of each micro-lens unit on the driving back plate is not less than that of an orthographic projection of the color filter corresponding to the micro-lens unit on the driving back plate.

8. The display panel of claim 6, wherein the plurality of sub-pixels comprises a plurality of first sub-pixels, a plurality of second sub-pixels, and a plurality of third sub-pixels, the plurality of color filters comprise a plurality of first color filters, a plurality of second color filters and a plurality of third color filters, the plurality of first color filters, the plurality of second color filters and the plurality of third color filters have different colors;

the plurality of first sub-pixels correspond to the plurality of first color filters, and the plurality of first sub-pixels and the plurality of first color filters have a same color;

the plurality of second sub-pixels correspond to the plurality of second color filters, and the plurality of second sub-pixels and the plurality of second color filters have a same color;

the plurality of third sub-pixels correspond to the plurality of third color filters, and the plurality of third sub-pixels and the plurality of third color filters have a same color;

openings where the plurality of first sub-pixels, the plurality of second sub-pixels and the plurality of third sub-pixels are located have different opening areas;

the plurality of first color filters, the plurality of second color filters and the plurality of third color filters have different thicknesses;

the plurality of micro-lens units comprise a plurality of first micro-lens units, a plurality of second micro-lens units, and a plurality of third micro-lens units, the plurality of first sub-pixels correspond to the plurality of first micro-lens units;

the plurality of second sub-pixels correspond to the plurality of second micro-lens units;

the plurality of third sub-pixels correspond to the plurality of third micro-lens units; and the plurality of first micro-lens units, the plurality of second micro-lens units, and the plurality of third micro-lens units have a same size and a same shape.

9. The display panel of claim 8, further comprising an encapsulation layer and a second planarization layer, the encapsulation layer is on a side of the plurality of sub-pixels away from the driving back plate and on a side of the color filter layer close to the driving back plate;

the second planarization layer is on a side of the color filter layer away from the driving back plate and on a side of the plurality of micro-lens units close to the driving back plate, surfaces of portions of the encapsulation layer away from the driving back plate are flush with each other;

surfaces of portions of the second planarization layer in contact with the first micro-lens unit, the second micro-lens unit, and the third micro-lens unit are flush with each other; and the portions of the second planarization layer in contact with the first micro-lens unit, the second micro-lens unit, and the third micro-lens unit have different thicknesses.

10. The display panel of claim 9, wherein an average value of thicknesses of the first color filter, the second color filter and the third color filter is a first average value, and a difference among thicknesses of the portions of the second planarization layer in contact with the first micro-lens unit, the second micro-lens unit and the third micro-lens unit is a difference among a difference between the thickness of the first color filter and the first average value, a difference between the thickness of the second color filter and the first average value and a difference between the thickness of the third color filter and the first average value; or a difference between the thicknesses of the portions of the second planarization layer in contact with the first micro-lens unit and the second micro-lens unit is a difference between the thicknesses of the first color filter and the second color filter; and a difference between the thicknesses of the portions of the second planarization layer in contact with the first micro-lens unit and the third micro-lens unit is a difference between the thicknesses of the first color filter and the third color filter.

11. The display panel of claim 9, further comprising a protective layer on a side of the plurality of micro-lens units away from the driving back plate;

wherein the second planarization layer has a same refractive index as each micro-lens unit;

the refractive index of each micro-lens unit is greater than that of the protective layer;

the refractive index of each micro-lens unit is n2, and the refractive index of the protective layer is n4, and $n2-n4>0.09$; and wherein $f=(n4 \times R1)/(n2-n4)$;

$f=h1 \times n5+h2 \times n6+h3 \times n7$;

where f is a focal length of each micro-lens unit; R1 is a radius of a circular are surface of the micro-lens unit away from the driving back plate; h1 is a thickness of the second planarization layer; n5 is the refractive index of the second planarization layer; h2 is a thickness of the color filter corresponding to the micro-lens unit; n6 is a refractive index of the color filter corresponding to the micro-lens unit; h3 is a thickness of a portion of the encapsulation layer corresponding to the micro-lens unit; and n7 is a refractive index of the portion of the encapsulation layer corresponding to the micro-lens unit.

12. The display panel of claim 8, further comprising an encapsulation layer and a second planarization layer, the encapsulation layer is located on a side of the plurality of sub-pixels away from the driving back plate and on a side of the color filter layer close to the driving back plate;

the second planarization layer is on a side of the color filter layer away from the driving back plate and on a side of the plurality of micro-lens units close to the driving back plate;

portions of the encapsulation layer in contact with the first color filter, the second color filter, and the third color filter have different thicknesses;

surfaces of portions of the first color filter, the second color filter, and the third color filter away from the driving back plate are flush with each other; and surfaces of portions of the second planarization layer away from the driving back plate are flush with each other.

13. The display panel of claim 12, wherein an average value of thicknesses of the first color filter, the second color filter and the third color filter is a first average value, and a difference among thicknesses of the portions of the encapsulation layer in contact with the first color filter, the second color filter and the third color filter is a difference among a difference between the thickness of the first color filter and the first average value, a difference between the thickness of the second color filter and the first average value and a difference between the thickness of the third color filter and the first average value; or wherein a difference between thicknesses of the portions of the encapsulation layer in contact with the first color filter and the second color filter is a difference between the thicknesses of the first color filter and the second color filter; and a difference between the thicknesses of the portions of the encapsulation layer in contact with the g first color filter and the third color filter is a difference between the thicknesses of the first color filter and the third color filter.

14. The display panel of claim 8, further comprising an encapsulation layer, a second planarization layer, and a third planarization layer, the encapsulation layer is on a side of the plurality of sub-pixels away from the driving back plate and on a side of the color filter layer close to the driving back plate, the second planarization layer is on a side of the color filter layer away from the driving back plate and on a side of the plurality of micro-lens units close to the driving back plate, the third planarization layer is on a side of the plurality of sub-pixels close to the driving back plate and on a side of the driving back plate close to the plurality of sub-pixels;

each first sub-pixel comprises a first anode, a first light-emitting functional layer and a first cathode sequentially stacked in a direction away from the third planarization layer;

each second sub-pixel comprises a second anode, a second light-emitting functional layer and a second cathode sequentially stacked in the direction away from the third planarization layer;

each third sub-pixel comprises a third anode, a third light-emitting functional layer and a third cathode sequentially stacked in the direction away from the third planarization layer;

portions of the third planarization layer in contact with the first anode, the second anode and the third anode have different thicknesses;

portions of the encapsulation layer in contact with the first color filter, the second color filter and the third color filter have a same thickness;

surfaces of portions of the first color filter, the second color filter, and the third color filter away from the driving back plate are flush with each other, and surfaces of portions of the second planarization layer away from the driving back plate are flush with each other.

15. The display panel of claim 14, wherein an average value of thicknesses of the first color filter, the second color filter, and the third color filter is a first average value, and a difference among thicknesses of the portions of the third planarization layer in contact with the first anode, the second anode and the third anode is a difference among a difference between the thickness of the first color filter and the first average value, a difference between the thickness of the second color filter and the first average value and a difference between the thickness of the third color filter and the first average value; or wherein a difference between thicknesses of the portions of the third planarization layer in contact with the first anode and the second anode is a difference between thicknesses of the first color filter and the second color filter; and a difference between thicknesses of the portions of the third planarization layer in contact with the first anode and the third anode is a difference between thicknesses of the first color filter and the third color filter.

16. The display panel of claim 1, wherein a surface of each micro-lens unit away from the driving back plate is a circular arc surface, and a surface of each micro-lens unit close to the driving back plate is a plane.

17. The display panel of claim 16, wherein an angle between a tangent line at an intersection point of the plane with the circular arc surface and the plane is in a range of 40° to 90°; and/or, where a distance between a vertex of the circular are surface and a center of the plane is H, a radius of the plane is R', and H/R' is in a range of 0.4 to 1.

18. The display panel of claim 1, wherein each micro-lens unit comprises one micro-lens, and a duty ratio of the micro-lens in an area of an orthographic projection of an opening where a sub-pixel corresponding to the micro-lens unit is located on the driving back plate is 100%; or each micro-lens unit comprises a plurality of micro-lenses, a duty ratio of which in an area of an orthographic projection of an opening where a sub-pixel corresponding to the micro-lens unit is located on the driving back plate is more than 70%.

19. A display apparatus, comprising the display panel of claim 1.

20. A method for manufacturing a display panel, comprising:

forming a driving back plate;

forming a pixel defining layer on a side of the driving back plate and forming a plurality of openings in the pixel defining layer;

forming a plurality of sub-pixels; where the plurality of sub-pixels are located in different openings of the plurality of openings, respectively; and forming a plurality of micro-lens units on a side of the plurality of sub-pixels away from the driving back plate;

wherein the plurality of micro-lens units are in a one-to-one correspondence with the plurality of sub-pixels, an orthographic projection of each micro-lens unit on the driving back plate covers an orthographic projection of an opening where the sub-pixel corresponding to the micro-lens unit is located on the driving back plate;

a pattern of each micro-lens unit, in any cross section which is perpendicular to the driving back plate and passes through a center of the orthographic projection of the micro-lens unit on the driving back plate, is axisymmetric with respect to an axis; the axis is a straight line which passes through the center of the orthographic projection of the micro-lens unit on the driving back plate and is perpendicular to the driving back plate;

in any cross section of the micro-lens unit which is perpendicular to the driving back plate and passes through the center of the orthographic projection of the micro-lens unit on the driving back plate, a distance from any point on a side of the micro-lens unit away from the driving back plate to the center of the orthographic projection of the micro-lens unit on the driving back plate is D, a length of a side of the micro-lens unit close to the driving back plate is 2R, and $0.9 \leq D/R \leq 1.0$.

* * * * *